(12) United States Patent
Ogata et al.

(10) Patent No.: US 7,851,127 B2
(45) Date of Patent: Dec. 14, 2010

(54) POLYMER COMPOUND, POSITIVE RESIST COMPOSITION AND RESIST PATTERN FORMING METHOD

(75) Inventors: Toshiyuki Ogata, Kawasaki (JP); Shogo Matsumaru, Kawasaki (JP); Hideo Hada, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 718 days.

(21) Appl. No.: 11/576,518

(22) PCT Filed: Sep. 22, 2005

(86) PCT No.: PCT/JP2005/017533
§ 371 (c)(1),
(2), (4) Date: Apr. 2, 2007

(87) PCT Pub. No.: WO2006/038477
PCT Pub. Date: Apr. 13, 2006

(65) Prior Publication Data
US 2009/0162784 A1    Jun. 25, 2009

(30) Foreign Application Priority Data
Oct. 4, 2004    (JP) .............................. 2004-291486

(51) Int. Cl.
*G03F 7/00* (2006.01)
*G03F 7/004* (2006.01)

(52) U.S. Cl. ..................... 430/270.1; 905/913; 905/945

(58) Field of Classification Search .............. 430/270.1, 430/905, 913, 945
See application file for complete search history.

(56) References Cited

U.S. PATENT DOCUMENTS

| 5,929,271 | A | 7/1999 | Hada et al. |
| 6,340,775 | B1 * | 1/2002 | Jacquot et al. ............... 568/376 |
| 6,927,009 | B2 * | 8/2005 | Kodama et al. ........... 430/270.1 |
| 6,982,354 | B2 * | 1/2006 | Thampi et al. .............. 568/361 |
| 2003/0073029 | A1 * | 4/2003 | Sato et al. ................. 430/270.1 |
| 2003/0170562 | A1 * | 9/2003 | Uenishi et al. ........... 430/270.1 |
| 2004/0058269 | A1 | 3/2004 | Hada et al. |
| 2004/0063827 | A1 | 4/2004 | Nishiyama et al. |
| 2004/0197708 | A1 * | 10/2004 | Kodama ..................... 430/311 |

FOREIGN PATENT DOCUMENTS

| EP | 1096319 | A1 * | 5/2001 |
| EP | 1353225 | A2 * | 10/2003 |
| EP | 1489459 | A1 * | 12/2004 |
| JP | 2001-188351 | | 7/2001 |
| JP | 2001188351 | A * | 7/2001 |
| JP | 2002-251012 | | 9/2002 |

OTHER PUBLICATIONS

Machine translation of JP 2002-188351.*
Machine translation of JP 2002-251012.*
International Search Report from PCT/JP2005/017533 dated Dec. 20, 2005.

* cited by examiner

*Primary Examiner*—Amanda C. Walke
(74) *Attorney, Agent, or Firm*—Knobbe, Martens, Olson & Bear, LLP

(57) ABSTRACT

The present invention relates to a polymer compound comprising at least one constituent unit (a0) selected from the group consisting of constituent units represented by the following general formulas (A0-1), (A0-2), (A0-3) and (A0-4) [wherein R represents a hydrogen atom or a lower alkyl group], and a constituent unit (a1) derived from an (a-lower alkyl)acrylate ester having an acid dissociable dissolution inhibiting group.

[Chemical Formula 1]

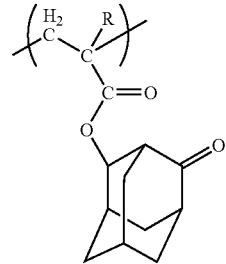

(a0-1)

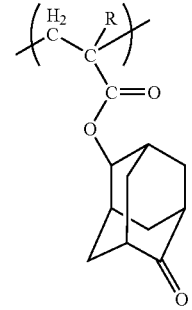

(a0-2)

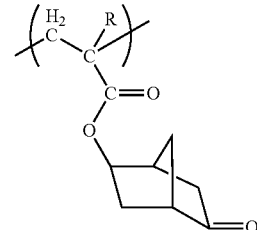

(a0-3)

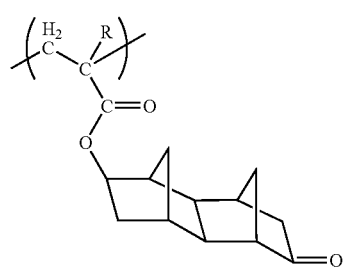

(a0-4)

9 Claims, No Drawings

POLYMER COMPOUND, POSITIVE RESIST COMPOSITION AND RESIST PATTERN FORMING METHOD

RELATED APPLICATIONS

This application is the U.S. National Phase filing under 35 U.S.C. §371 of PCT/JP2005/017533, filed Sep. 22, 2005, which designated the United States and was published in a language other than English, which claims priority under 35 U.S.C. §119(a)-(d) to Japanese Patent Application No. 2004-291486, filed Oct. 4, 2004. The content of these applications is incorporated herein by reference in their entireties.

TECHNICAL FIELD

The present invention relates to a polymer compound, a positive resist composition containing the polymer compound, and a resist pattern forming method using the resist composition.

BACKGROUND ART

In the production of semiconductor devices and liquid crystal displays, rapid progress has recently been made in fining of a pattern with the progress of a lithography technology. As a technique for fining of the size, shortening of the wavelength of an exposure light source is generally performed. Specifically, while ultraviolet rays typified by g-ray and i-ray have hitherto been used, mass production of semiconductor devices using a KrF excimer laser or an ArF excimer laser has recently started. Also, a study about a $F_2$ excimer laser having a shorter wavelength than that of these excimer lasers, electron beam, extreme ultraviolet rays, and X-rays have been made.

Also, as one of resist materials which satisfy high resolution capable of reproducing a pattern having a fine size, a chemically amplified resist composition containing a base resin wherein alkali solubility varies by an action of an acid, and an acid generator which generates an acid upon exposure is known. The chemically amplified resist composition includes, for example, a negative chemically amplified resist composition containing an alkali soluble resin, an acid generator, and a crosslinking agent, and a positive chemically amplified resist composition containing a resin wherein alkali solubility enhances by an action of an acid, and an acid generator.

At present, as a base resin of a resist in an ArF excimer laser lithography, a resin (acrylic resin) having a constituent unit derived from (meth)acrylic acid is mainly used because it is excellent in transparency to light of about 193 nm.

In these acrylic resins, a polycyclic alicyclic group such as adamantyl group, as a substituent of the ester moiety of a (meth)acrylate ester, is commonly introduced so as to improve etching resistance. For example, Japanese Unexamined Patent Application, First Publication No. 2003-167347 proposes a polymer comprising a constituent unit derived from a (meth)acrylate ester having an acid dissociable dissolution inhibiting group in the ester moiety, a constituent unit derived from a (meth)acrylate ester having a lactone skeleton such as γ-butyrolactone skeleton in the ester moiety, and a constituent unit derived from a (meth)acrylate ester having a polycyclic group including a polar group such as hydroxyl group in the ester moiety.

However, a resist using such a polymer has a problem such as poor affinity for an alkali developing solution. Poor affinity for an alkali developing solution can cause defects on the surface of a resist pattern after the development (development defects) and roughness on the surface of the side wall of a resist pattern (line edge roughness (LER)). The development defects mean entire inconveniences detected when the developed resist pattern is observed right above using a surface defect inspection equipment (trade name "KLA") manufactured by KLA-TENCOR CORPORATION and these inconveniences include, for example, scum, foam, dust, bridge between resist patterns, irregular color, and precipitate after the development. Development defects and LER may exert an adverse influence on formation of a fine semiconductor device.

As a method of enhancing affinity for an alkali developing solution, for example, there can be employed a method of decreasing the proportion of a constituent unit having a highly hydrophobic acid dissociable dissolution inhibiting group in the above polymer or increasing the proportion of a constituent unit having a polar group. However, when these methods are used, resolution of the resulting resist pattern deteriorates.

DISCLOSURE OF THE INVENTION

Under these circumstances, the present invention has been made and an object thereof is to provide a resist composition which has high affinity for an alkali developing solution and also can form a resist pattern with high resolution, a polymer compound suited for use as the resist composition, and a resist pattern forming method.

The present inventors have intensively studied and found that the above object is achieved by a polymer comprising a constituent unit having an acid dissociable dissolution inhibiting group, and a constituent unit derived from an (a-lower alkyl)acrylate ester having a group wherein an oxygen atom (=O) is bonded with a carbon atoms on a skeleton of an aliphatic ring having a specific structure, and thus the present invention has been completed.

That is, a first aspect of the present invention is a polymer compound comprising at least one constituent unit (a0) selected from the group consisting of constituent units represented by the following general formulas (a0-1), (a0-2), (a0-3) and (a0-4):

[Chemical Formula 1]

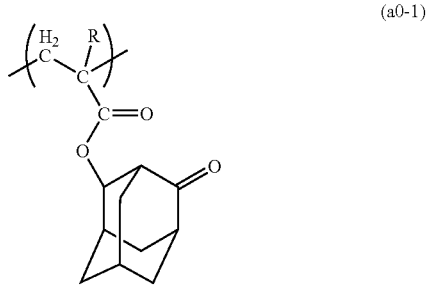

(a0-1)

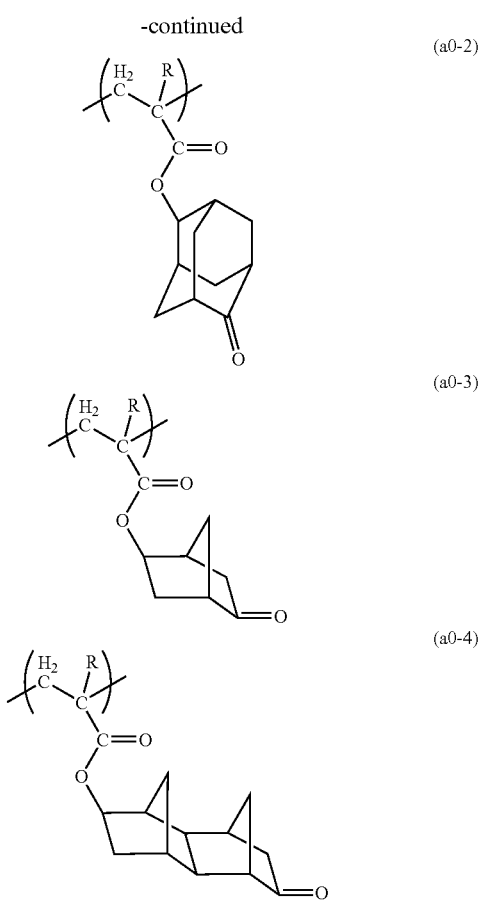

wherein R represents a hydrogen atom or a lower alkyl group, and a constituent unit (a1) derived from an (a-lower alkyl) acrylate ester having an acid dissociable dissolution inhibiting group.

A second aspect of the present invention is a positive resist composition comprising a resin component (A) wherein alkali solubility enhances by an action of an acid, and an acid generator component (B) which generates an acid upon exposure, wherein the resin component (A) contains the polymer compound described of the first aspect.

Furthermore, a third aspect of the present invention is a resist pattern forming method, which comprises the steps of forming a resist film on a substrate using the positive resist composition of the second aspect, exposing the resist film, and developing the resist film to form a resist pattern.

In the present invention, "constituent unit" means a monomer unit constituting a polymer.

Also, as used herein, "(a-lower alkyl)acrylate ester" means either or both of an a-lower alkylacrylate ester such as methacrylate ester, and an acrylate ester. As used herein, "a-lower alkylacrylate esters" means that those wherein a hydrogen atom bonded with an a-carbon atom of an acrylate ester is substituted with a lower alkyl group. As used herein, "constituent unit derived from an (a-lower alkyl)acrylate ester" means a constituent unit formed by cleavage of an ethylenical double bond of an (a-lower alkyl)acrylate ester.

Also, "exposure" has a concept including entire irradiation with radiation.

According to the present invention, it is possible to provide a resist composition which has high affinity for an alkali developing solution and also can form a resist pattern with high resolution, a polymer compound suited for use as the resist composition, and a resist pattern forming method.

BEST MODE FOR CARRYING OUT THE INVENTION

Polymer Compound

The polymer compound of the present invention (hereinafter referred to as a polymer compound (A1), sometimes) comprises at least one constituent unit (a0) represented by the above general formulas (A0-1), (A0-2), (A0-3) and (A0-4), and a constituent unit (a1) derived from an (a-lower alkyl) acrylate ester having an acid dissociable dissolution inhibiting group.

Constituent Unit (a0)

The constituent unit (a0) comprises at least one selected from the group consisting of a constituent unit represented by the formula (a0-1), a constituent unit represented by the formula (a0-2), a constituent unit represented by the formula (a0-3), and a constituent unit represented by the formula (a0-4). It is preferable to comprise a constituent unit represented by the formula (a0-1) and/or a constituent unit represented by the formula (a0-2) among these constituent units in view of excellent effects of the present invention.

In the general formulas (a0-1), (a0-2), (a0-3) and (a0-4), R each independently represents a hydrogen atom or a lower alkyl group.

The lower alkyl group as for R is an alkyl group having 1 to 5 carbon atoms and is specifically a lower linear or branched alkyl group such as methyl group, ethyl group, propyl group, isopropyl group, n-butyl group, isobutyl group, tert-butyl group, pentyl group, isopentyl group, or neopentyl group.

In view of easy availability, R is preferably a hydrogen atom or a methyl group.

The constituent unit (a0) may be used alone or in combination.

In the polymer compound (A1), the proportion of the constituent unit (a0) is preferably from 10 to 60 mol %, more preferably from 15 to 55 mol %, and still more preferably from 25 to 50 mol %, based on the entire constituent unit constituting the polymer compound (A1). By adjusting the proportion to the lower limit or more, sufficient effects of the present invention can be exerted and, when the proportion is adjusted to the upper limit or less, it is possible to balance the constituent unit (a0) and the other constituent unit.

Constituent Unit (a1)

The constituent unit (a1) is a constituent unit derived from an (α-lower alkyl)acrylate ester having an acid dissociable dissolution inhibiting group.

The lower alkyl group as a substituent at the a-position of the (a-lower alkyl)acrylate ester includes the same lower alkyl group as for R in the constituent unit (a0).

As the acid dissociable dissolution inhibiting group in the constituent unit (a1), for example, it is possible to use an acid dissociable dissolution inhibiting group, which has hitherto been proposed as the acid dissociable dissolution inhibiting group of a base resin for a chemically amplified photoresist, as long as it has alkali dissolution inhibiting properties capable of making the entire polymer compound (A1) to be insoluble in an alkali before the dissociation, and also can make the entire polymer compound (A1) to be soluble in an alkali after the association. Commonly, a group capable of forming a carboxy group of (meth)acrylic acid together with a cyclic or chain tertiary alkyl ester, or a group capable of forming a cyclic or chain alkoxyalkyl group have widely been known. As used herein, "(meth)acrylate ester" means either or both of an acrylate ester and a methacrylate ester.

As used herein, a tertiary alkyl ester means a structure wherein a hydrogen atom of a carboxyl group is substituted with an alkyl group or a cycloalkyl group to form an ester and a tertiary carbon atom of the alkyl group or cycloalkyl group is bonded with an oxygen atom at the end of a carbonyloxy group (—C(O)—O—).

In this tertiary alkyl ester, when reacted with an acid, a bond between the oxygen atom and the tertiary carbon atom is cleaved.

The alkyl group or cycloalkyl group may have a substituent.

Hereinafter, a group, which constitutes a tertiary alkyl ester together with a carboxyl group and is therefore acid dissociable, is referred to as a "tertiary alkyl ester type acid dissociable dissolution inhibiting group" for convenience.

Also, a cyclic or chain alkoxyalkyl group means a structure wherein a hydrogen atom of a carboxyl group is substituted with an alkoxyalkyl group to form an ester and the alkoxyalkyl group is bonded with an oxygen atom at the ends of a carbonyloxy group (—C(O)—O—). When this alkoxyalkyl ester group is reacted with an acid, a bond between an oxygen atom and an alkoxyalkyl group is cleaved.

More specifically, the constituent unit (a1) includes constituent units represented by the following general formulas (a1-1) to (a1-4):

[Chemical Formula 2]

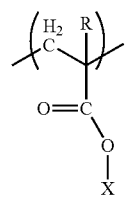

(a1-1)

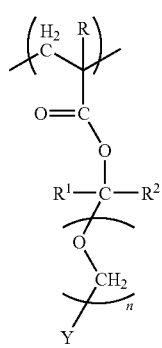

(a1-2)

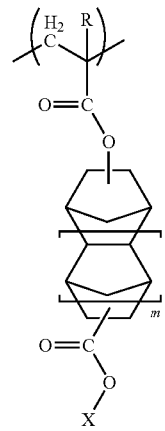

(a1-3)

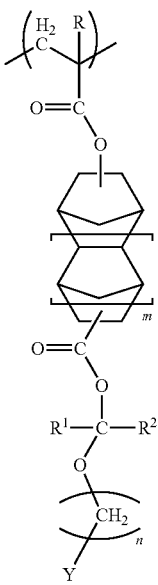

(a1-4)

wherein X represents a tertiary alkyl ester type acid dissociable dissolution inhibiting group, Y represents a lower alkyl group having 1 to 5 carbon atoms, or an aliphatic cyclic group; n represents an integer of 0 or 1 to 3; m represents 0 or 1; and R, $R^1$ and $R^2$ each independently represents a hydrogen atom or a lower alkyl group having 1 to carbon atoms; and at least one of $R^1$ and $R^2$ is preferably a hydrogen atom and, and more preferably are simultaneously hydrogen atoms; and n is preferably 0 or 1.

"Aliphatic" in the specification and claims is a relative concept to an aromatic and is defined as a group or compound having no aromaticity.

An "aliphatic cyclic group" means a monocyclic or polycyclic group having no aromaticity.

At this time, the "aliphatic cyclic group" may have a substituent or not.

Examples of the substituent include a lower alkyl group having 1 to 5 carbon atoms, a fluorine atom, a fluorinated lower alkyl group having 1 to 5 carbon atoms substituted with a fluorine atom, and =O.

The structure of a basic ring wherein a substituent of an "aliphatic cyclic group" is eliminated is not limited to a group composed of carbon and hydrogen (hydrocarbon group), but is preferably a hydrocarbon group. Also, a "hydrocarbon group" may be saturated or unsaturated, but is preferably saturated. Preferably, it is a polycyclic group (alicyclic group).

Specific examples of such an aliphatic cyclic group include groups wherein one or more hydrogen atoms are eliminated from a polycycloalkane such as monocycloalkane, bicycloalkane, tricycloalkane or tetracycloalkane, which may be substituted or not substituted with a fluorine atom or a fluorinated alkyl group. Specifically, the aliphatic cyclic group includes groups wherein one or more hydrogen atoms are eliminated from a monocycloalkane such as cyclopentane or cyclohexane, or a polycycloalkane such as adamantane, norbornane, isobornane, tricyclodecane, or tetracyclododecane.

X is a tertiary alkyl ester type acid dissociable dissolution inhibiting group, that is, a group capable of forming a tertiary alkyl ester together with a carboxy group. Examples thereof include an aliphatic branched acid dissociable dissolution inhibiting group, and an acid dissociable dissolution inhibiting group having an aliphatic cyclic group.

In X, specific aliphatic branched acid dissociable dissolution inhibiting group include tert-butyl group and tert-amyl group.

In X, the acid dissociable dissolution inhibiting group having an aliphatic cyclic group includes, for example, a group having a tertiary carbon atom on a ring skeleton of a cycloalkyl group, and specific examples thereof include 2-alkyladamantyl group such as 2-methyl-adamantyl group and 2-ethyladamantyl group. Alternatively, there is exemplified a group having an aliphatic cyclic group such as adamantyl group, and a branched alkylene group having a tertiary carbon atom bonded thereto, like a constituent unit represented by the following general formula:

[Chemical Formula 3]

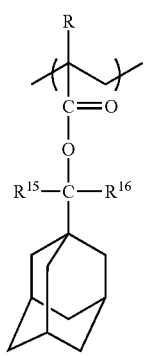

wherein R is as defined above, and $R^{15}$ and $R^{16}$ represent an alkyl group (which may be linear or branched and preferably has 1 to 5 carbon atoms).

Specific examples of the constituent units represented by the above general formula (a1-1) to (a1-4) are shown below.

[Chemical Formula 4]

(a1-1-1)
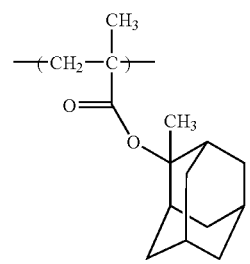

(a1-1-2)
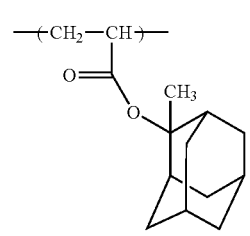

(a1-1-3)
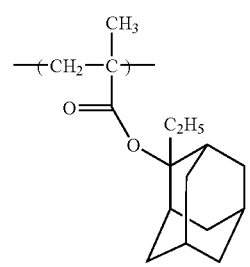

(a1-1-4)
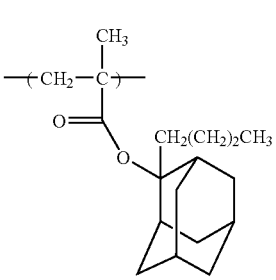

(a1-1-5)
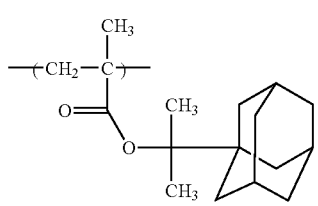

(a1-1-6)
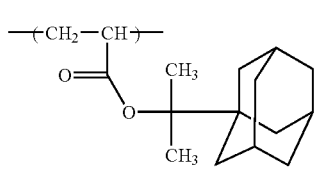

(a1-1-7)
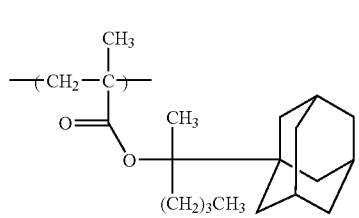

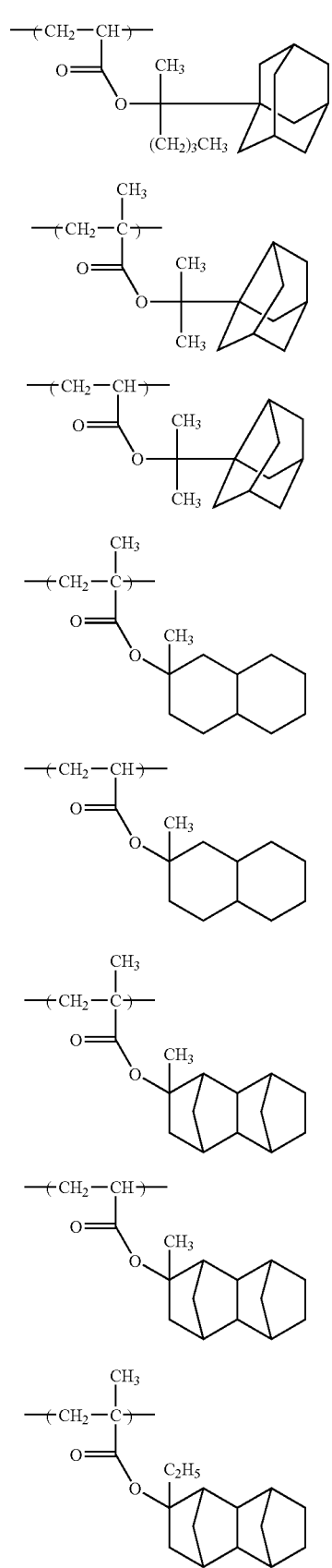
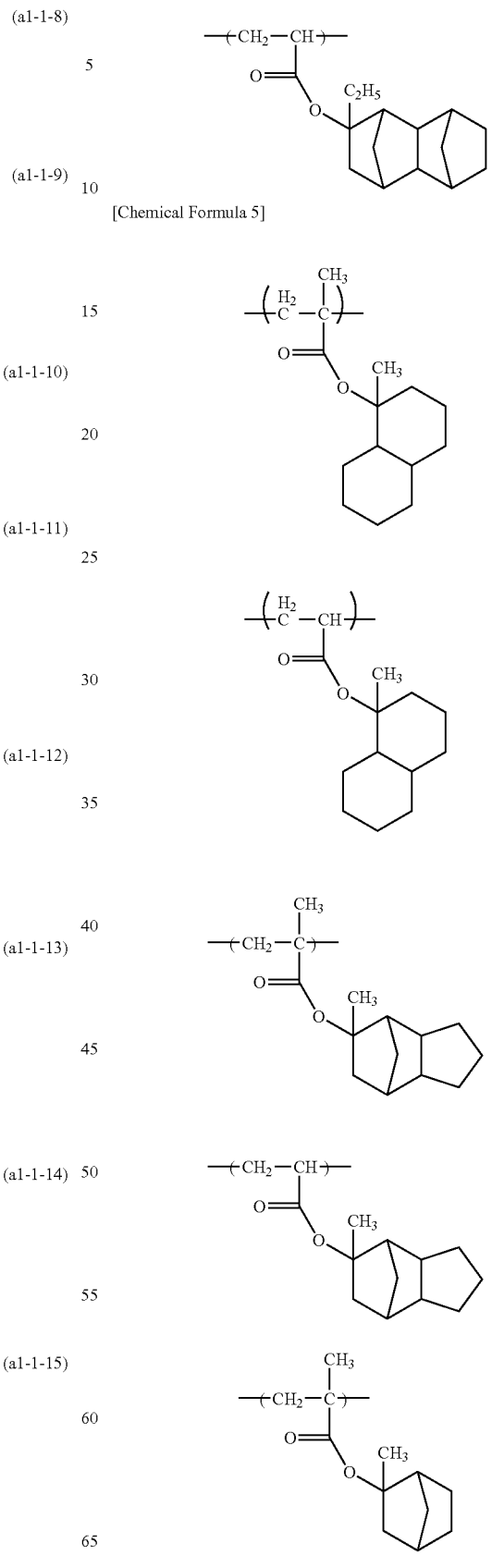
[Chemical Formula 5]

-continued
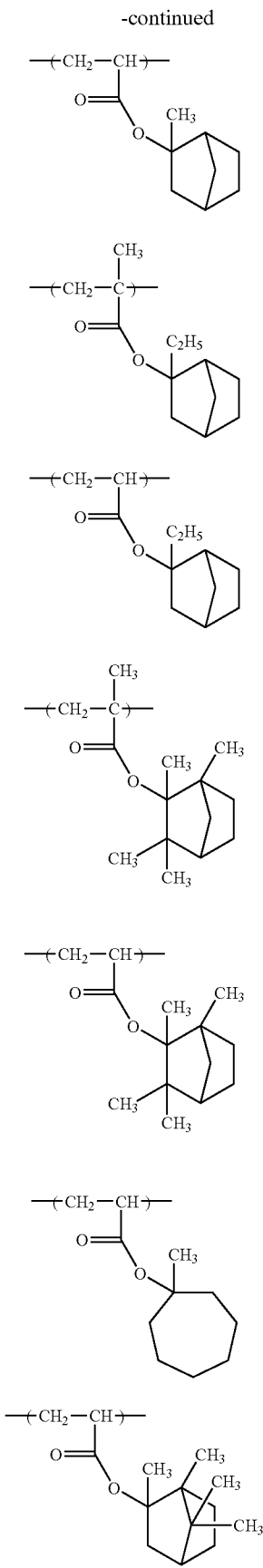
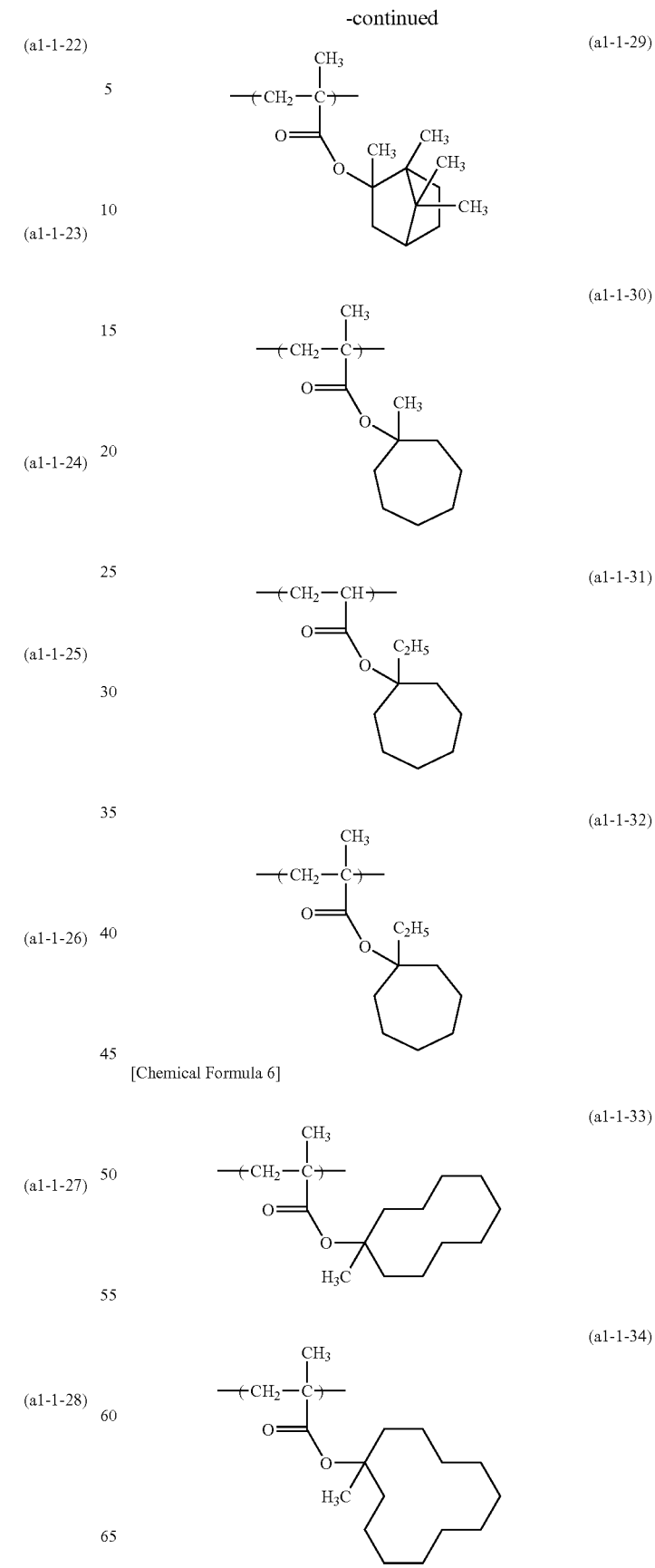
[Chemical Formula 6]

-continued
(a1-1-35) 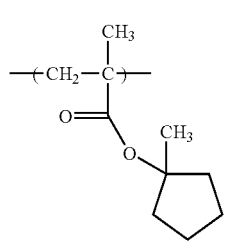
(a1-1-36) 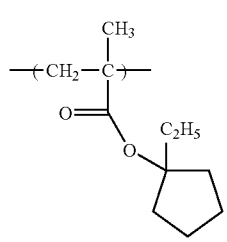
(a1-1-37) 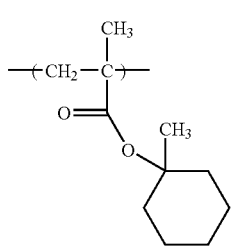
(a1-1-38) 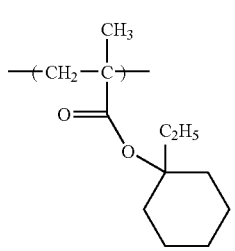
(a1-1-39) 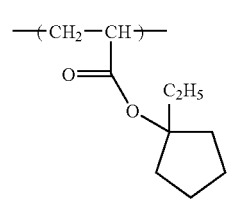
(a1-1-40) 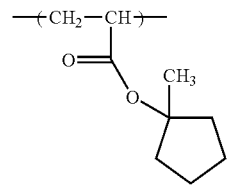
[Chemical Formula 7]
(a1-2-1) 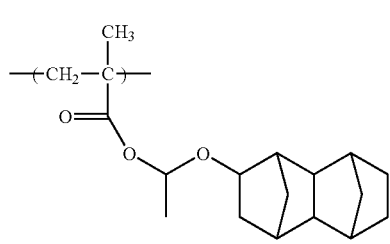
-continued
(a1-2-2) 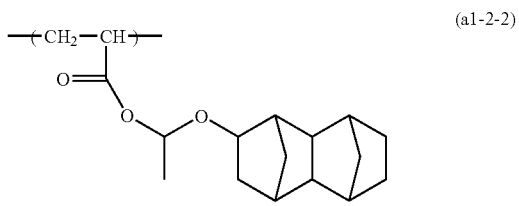
(a1-2-3) 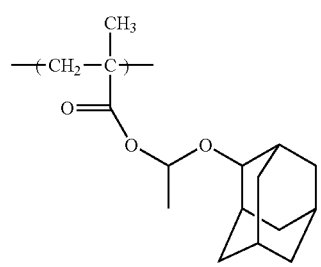
(a1-2-4) 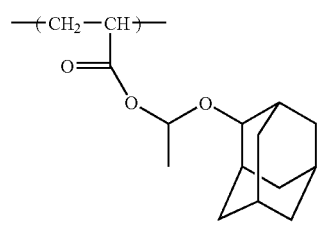
(a1-2-5) 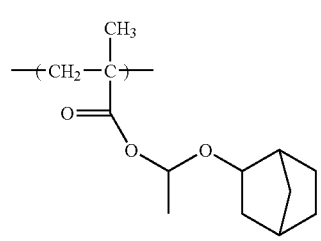
(a1-2-6) 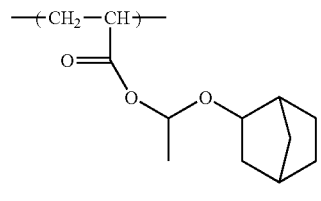
[Chemical Formula 8]
(a1-2-7) 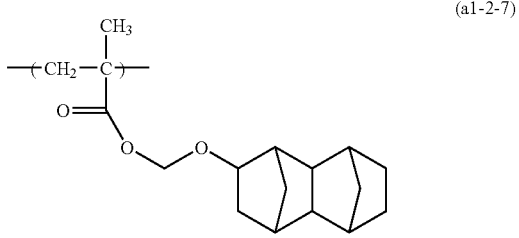
(a1-2-8) 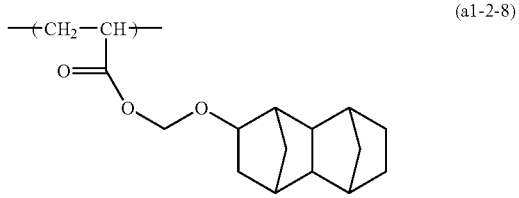

(a1-2-9) 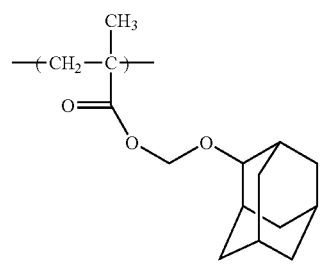
(a1-2-10) 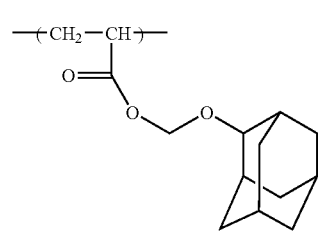
(a1-2-11) 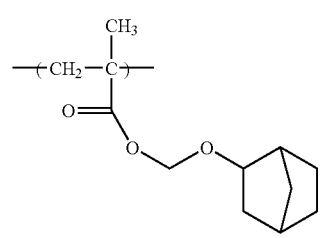
(a1-2-12) 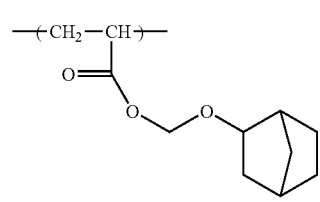
(a1-2-13) 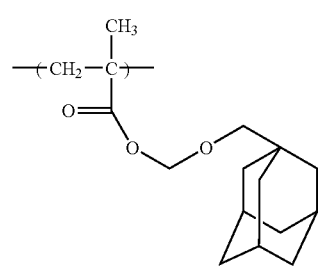
(a1-2-14) 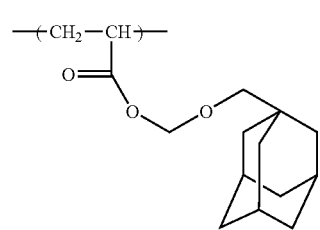
(a1-2-15) 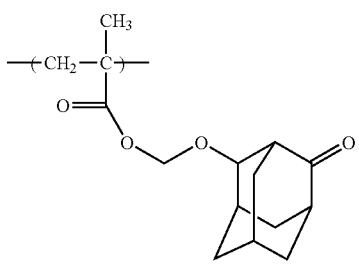
(a1-2-16) 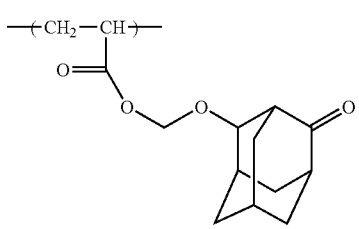
[Chemical Formula 9]
(a1-3-1) 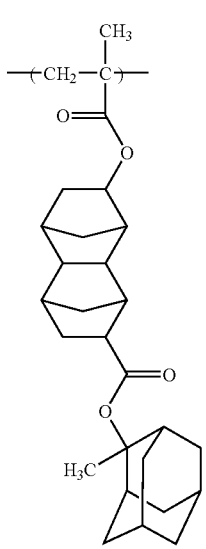
(a1-3-2) 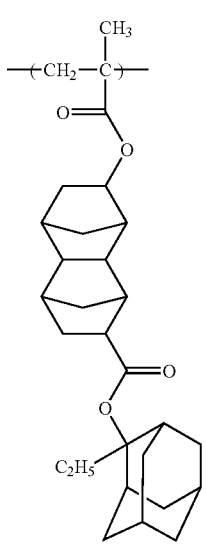

-continued
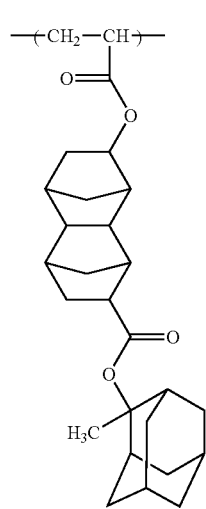
(a1-3-3)
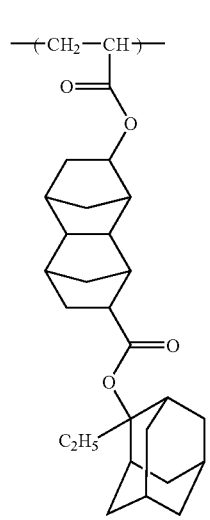
(a1-3-4)
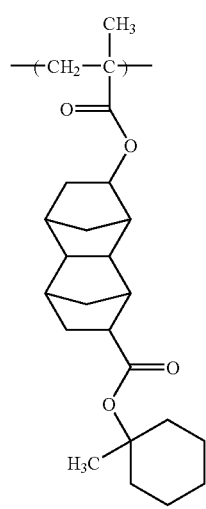
(a1-3-5)
-continued
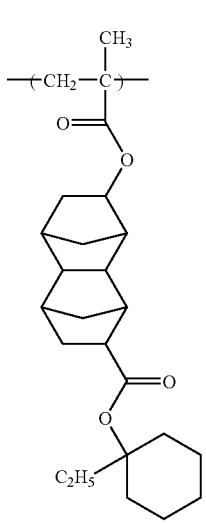
(a1-3-6)
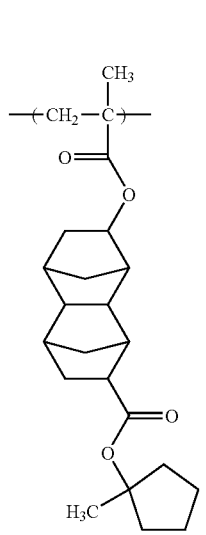
(a1-3-7)
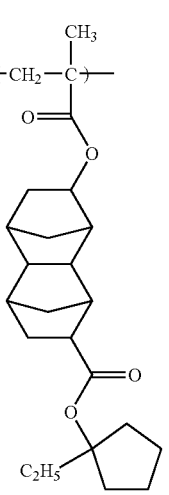
(a1-3-8)

-continued
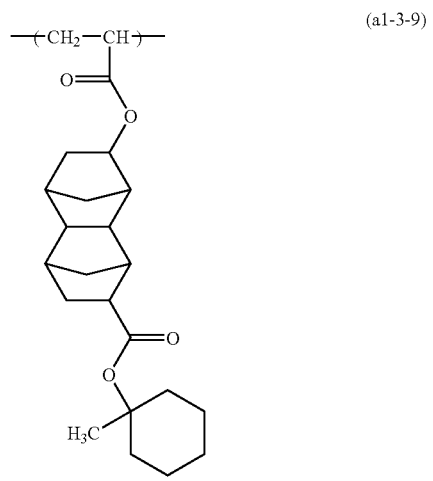
(a1-3-9)
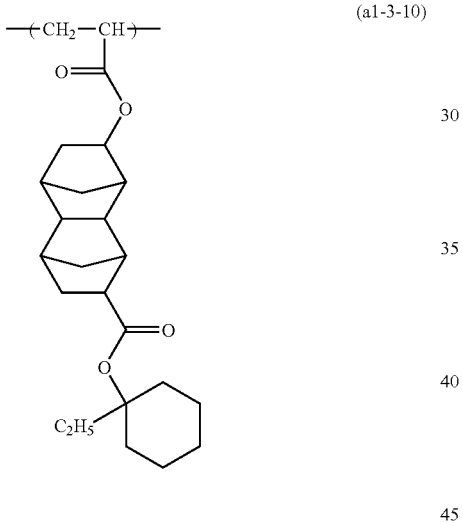
(a1-3-10)
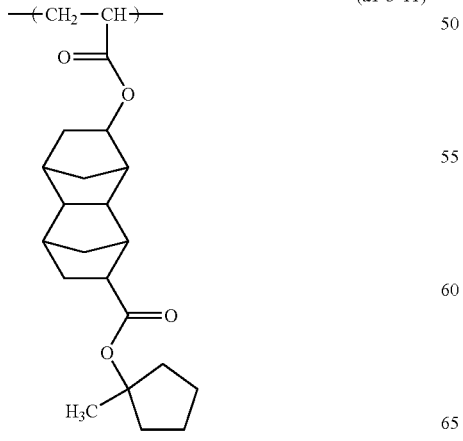
(a1-3-11)
-continued
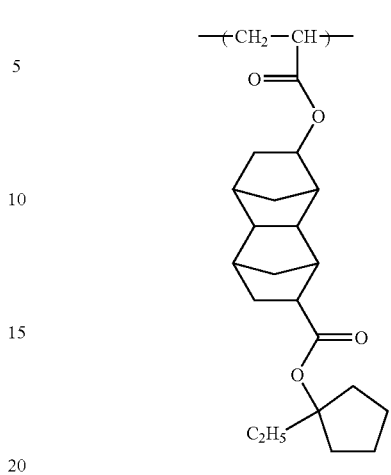
(a1-3-12)
[Chemical Formula 10]
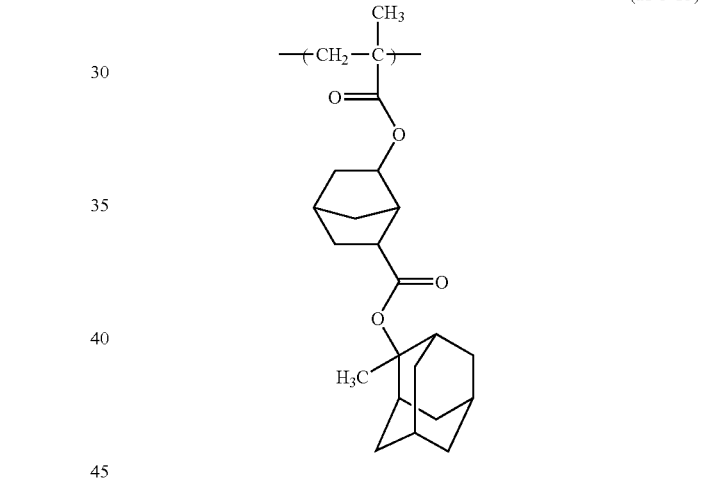
(a1-3-13)
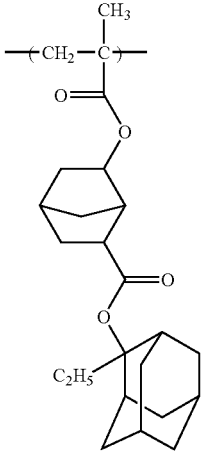
(a1-3-14)

-continued
(a1-3-15)
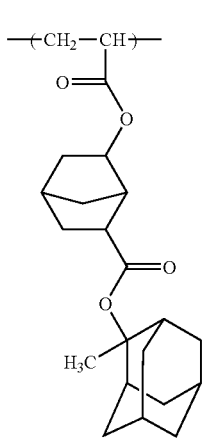
(a1-3-16)
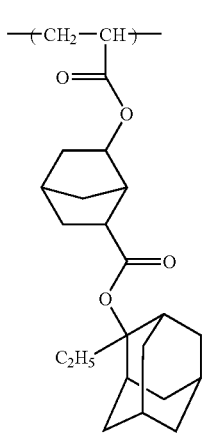
(a1-3-17)
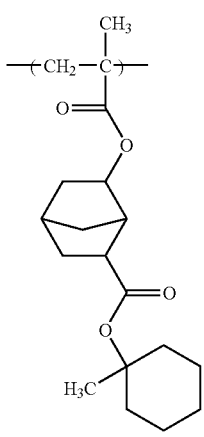
-continued
(a1-3-18)
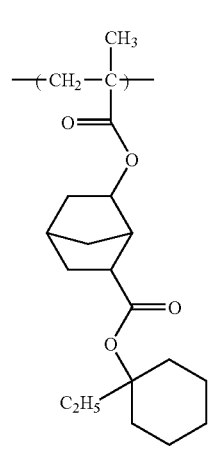
(a1-3-19)
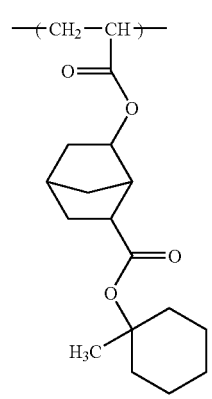
(a1-3-20)
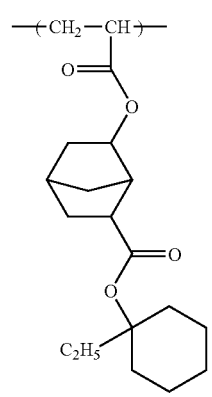
(a1-3-21)
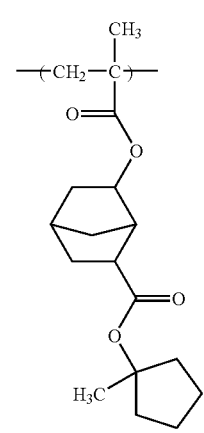

[Chemical Formula 11]
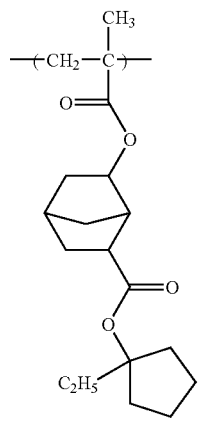 (a1-3-22)
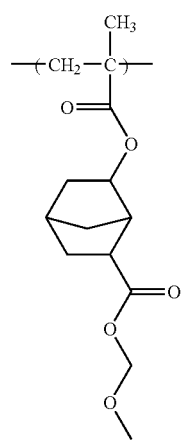 (a1-4-1)
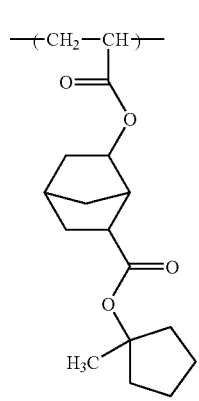 (a1-3-23)
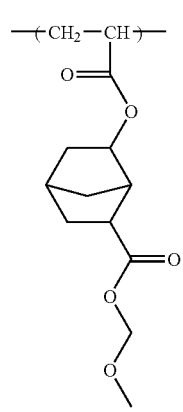 (a1-4-2)
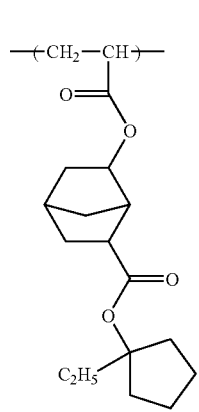 (a1-3-24)
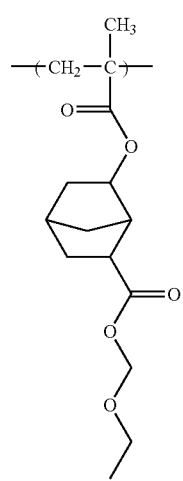 (a1-4-3)

-continued
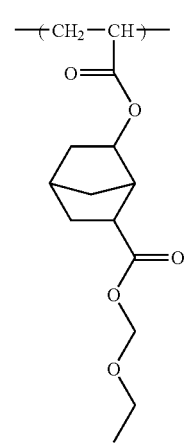
(a1-4-4)
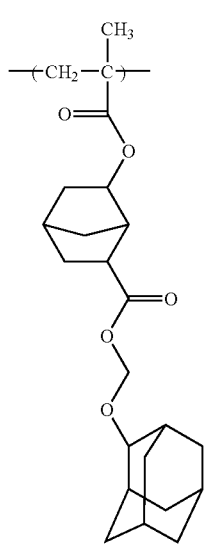
(a1-4-5)
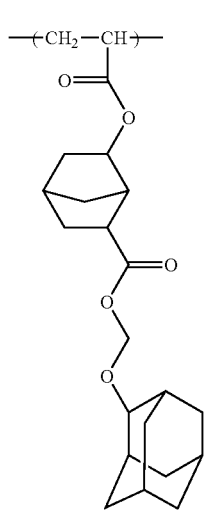
(a1-4-6)
-continued
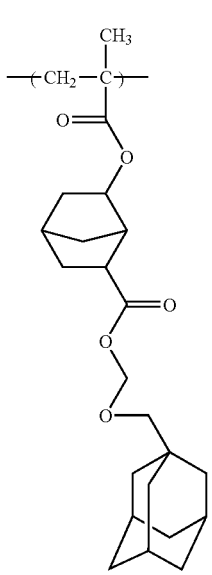
(a1-4-7)
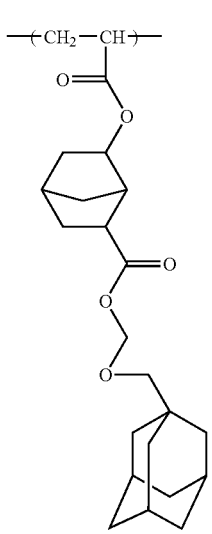
(a1-4-8)
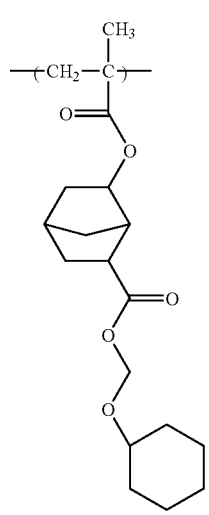
(a1-4-9)

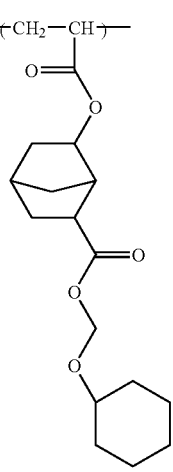
(a1-4-10)
(a1-4-11)
(a1-4-12)
[Chemical Formula 12]
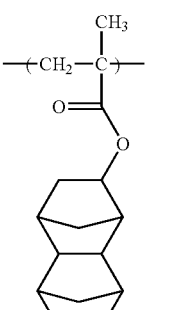
(a1-4-13)
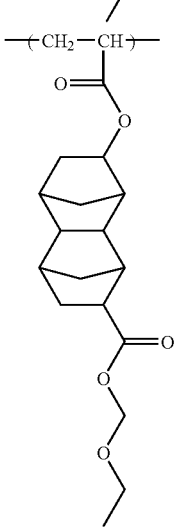
(a1-4-14)
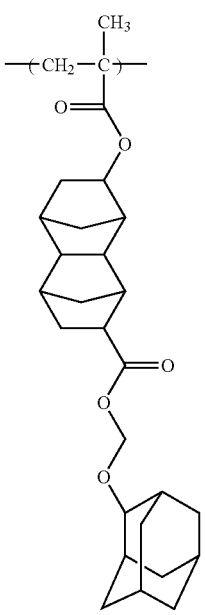
(a1-4-15)

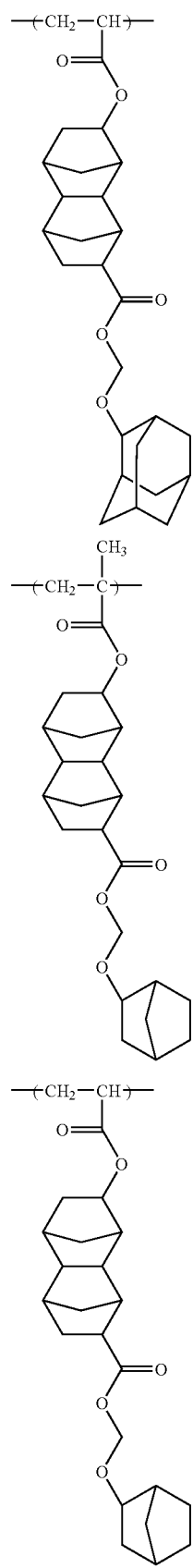

(a1-4-21)
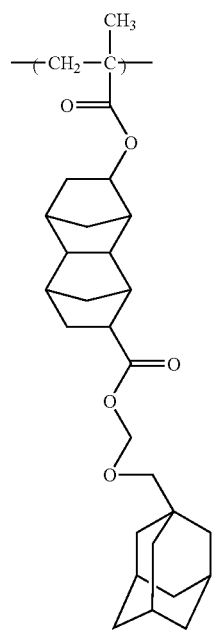
(a1-4-22)
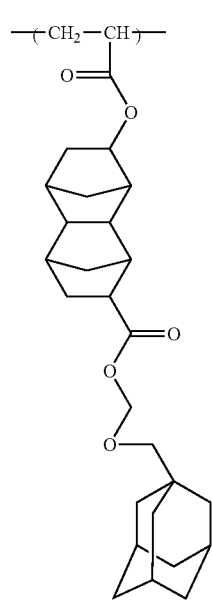
(a1-4-23)
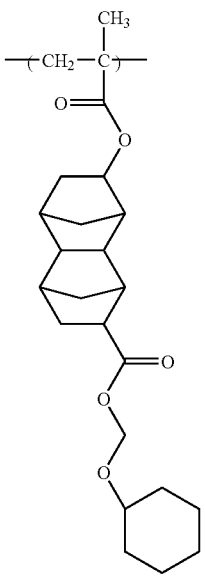
(a1-4-24)
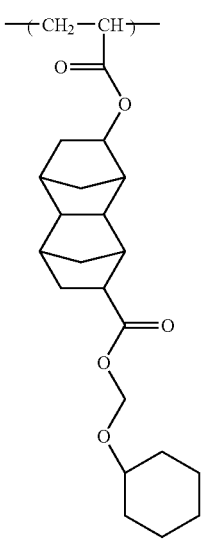

-continued

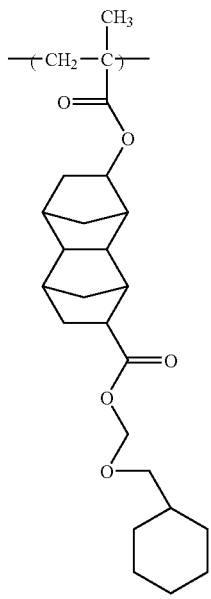
(a1-4-25)

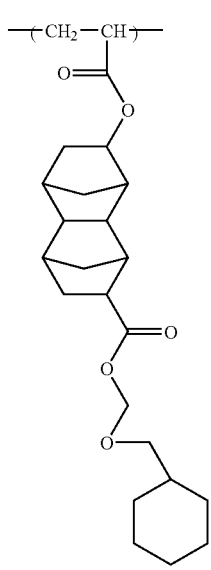
(a1-4-26)

-continued

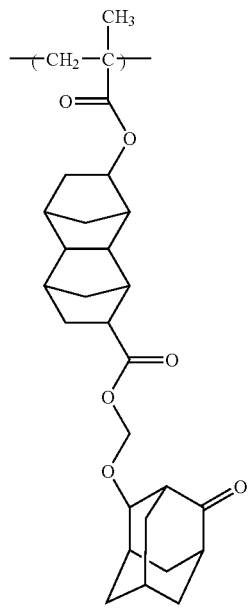
(a1-4-27)

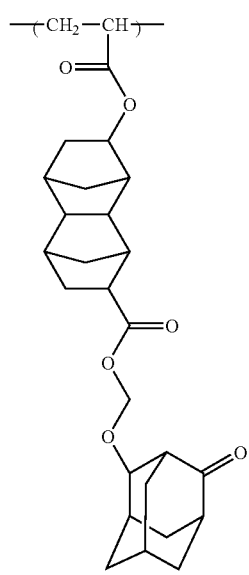
(a1-4-28)

The constituent unit (a1) may be used alone or in combination. Among these units, a constituent unit represented by the general formula (a1-1) is preferable and a least one selected from constituent units represented by (a1-1-1) to (a1-1-6) or (a1-1-35) to (a1-1-40) is more preferable.

In the polymer compound (A1), the proportion of the constituent unit (a1) is preferably from 10 to 80 mol %, more preferably from 15 to 70 mol %, and still more preferably from 20 to 50 mol %, based on the entire constituent unit constituting the polymer compound (A1). When the proportion is adjusted to the lower limit or more, a pattern can be obtained when a resist composition is prepared. On the other hand, when the proportion is adjusted to the upper limit or less, it is possible to balance the constituent unit (a1) and the other constituent unit.

Constituent Unit (a2)

The polymer compound (A1) preferably has, in addition to the constituent unit (a0) and the constituent unit (a1), a constituent unit (a2) derived from an (a-lower alkyl)acrylate ester having a lactone-containing monocyclic or polycyclic group.

The lactone-containing monocyclic or polycyclic group of the constituent unit (a2) is effective to enhance adhesion of a resist film to a substrate and hydrtophilicity to a developing solution when the polymer compound (A1) is used to form a resist film.

As used herein, the lactone-containing monocyclic or polycyclic group means a cyclic group containing one ring (lactone ring) including a —O—C(O)-structure. The lactone ring is counted as a first ring and, in the case of only the lactone ring, it is referred to as a monocyclic group. In the case of further having the other ring structure, it is referred to as a polycyclic group regardless of the structure.

The constituent unit (a2) is not specifically limited as long as it has both a lactone structure (—O—C(O)—) and a ring group, and any constituent unit can be used.

Specifically, the lactone-containing monocyclic group includes a group wherein one hydrogen atom is eliminated from γ-butyrolactone. The lactone-containing polycyclic group includes a group wherein one hydrogen atom is eliminated from bicycloalkane, tricycloalkane, or tetracycloalkane each having a lactone ring. Particularly, a group wherein one hydrogen atom is eliminated from a lactone-containing tricycloalkane having the following structural formula is advantageous in view of easy availability.

[Chemical Formula 14]

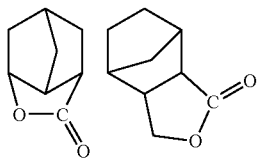

More specifically, examples of the constituent unit (a2) include constituent units represented by the following general formula s(a2-1) to (a2-5):

[Chemical Formula 15]

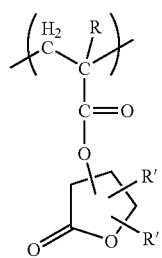
(a2-1)

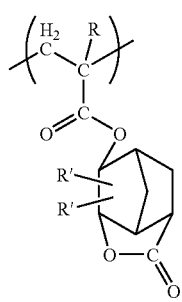
(a2-2)

-continued

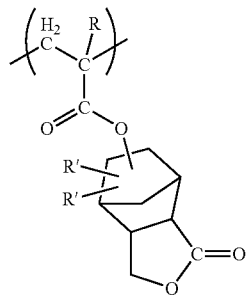
(a2-3)

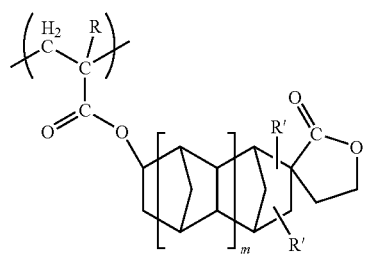
(a2-4)

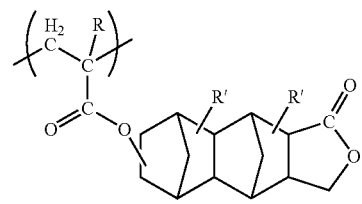
(a2-5)

wherein R represents a hydrogen atom or a lower alkyl group, R' represents a hydrogen atom, a lower alkyl group, or an alkoxyl group having 1 to 5 carbon atoms, and m represents an integer of 0 or 1.

The lower alkyl group as for R and R' in the general formulas (a2-1) to (a2-5) is the same lower alkyl group as for R in the constituent unit (a1).

In the general formulas (a2-1) to (a2-5), R' is preferably a hydrogen atom in view of easy availability.

Specifically, constituent units of the general formulas (a2-1) to (a2-5) are shown below.

[Chemical Formula 16]

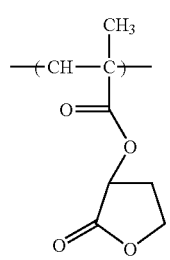
(a2-1-1)

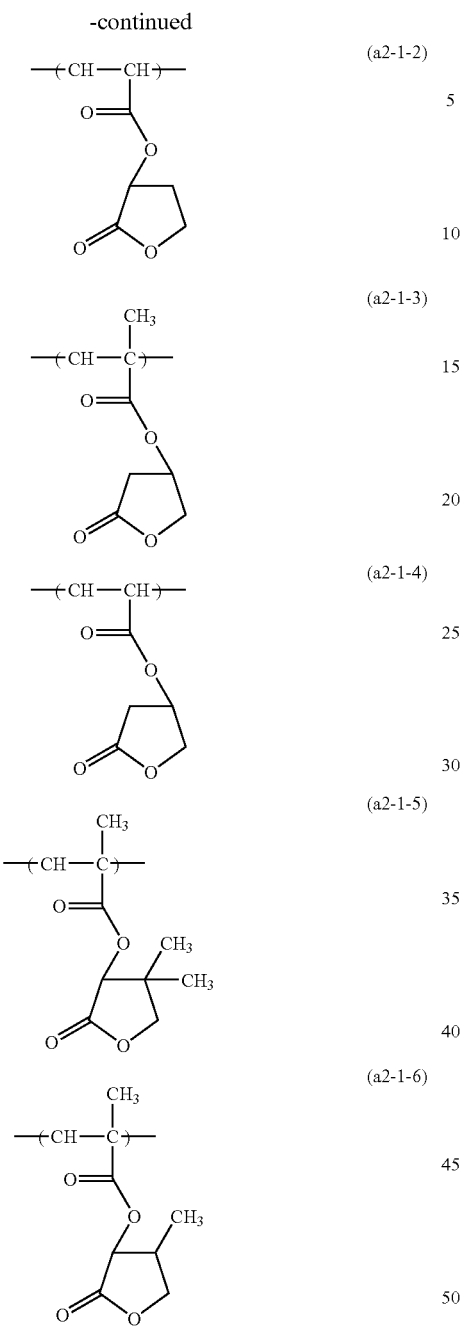
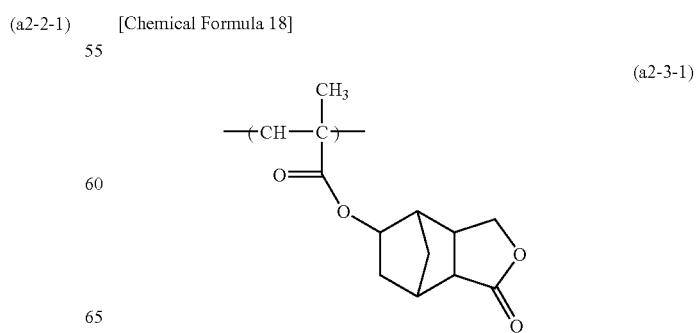
[Chemical Formula 17]
[Chemical Formula 18]

(a2-3-2) 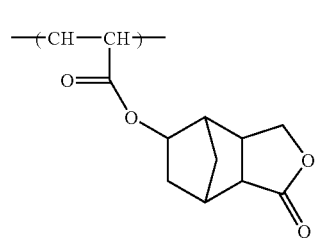
(a2-3-3) 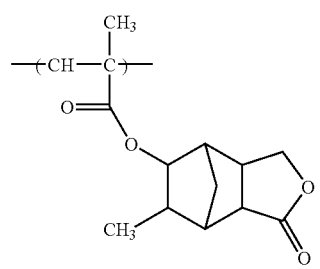
(a2-3-4) 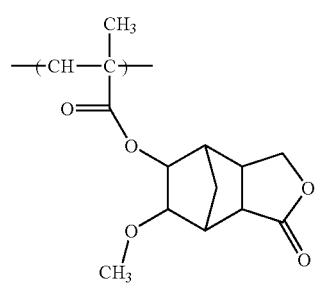
(a2-3-5) 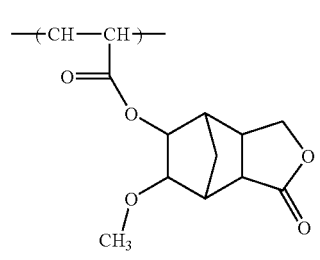
(a2-3-6) 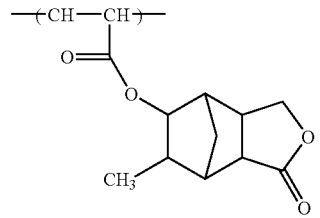
(a2-3-7) 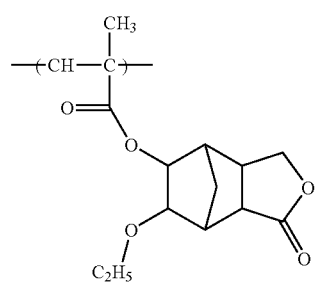
(a2-3-8) 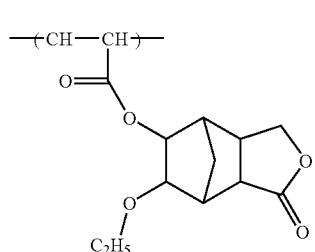
(a2-3-9) 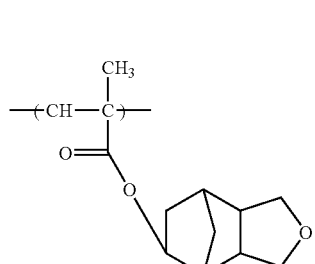
(a2-3-10) 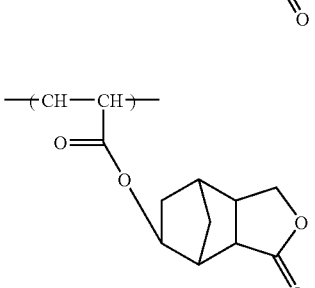
[Chemical Formula 19]
(a2-4-1) 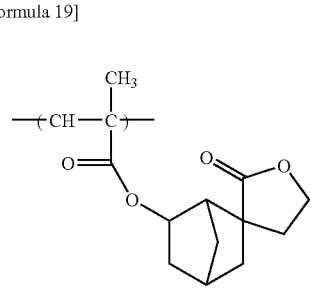
(a2-4-2) 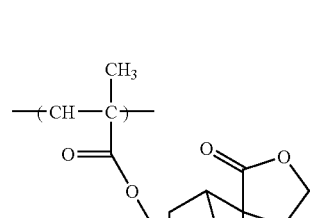
(a2-4-3)

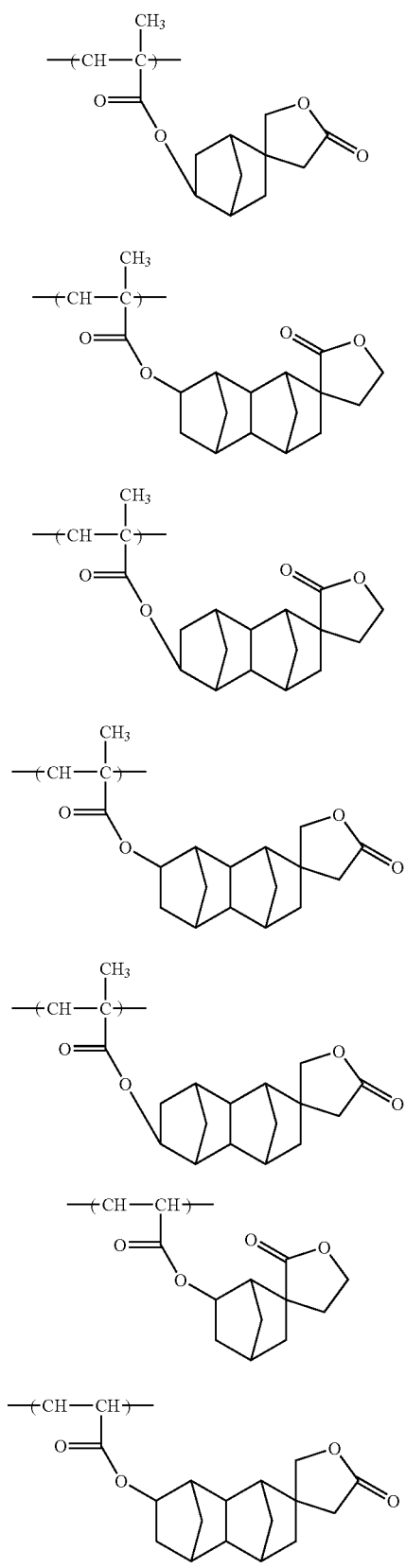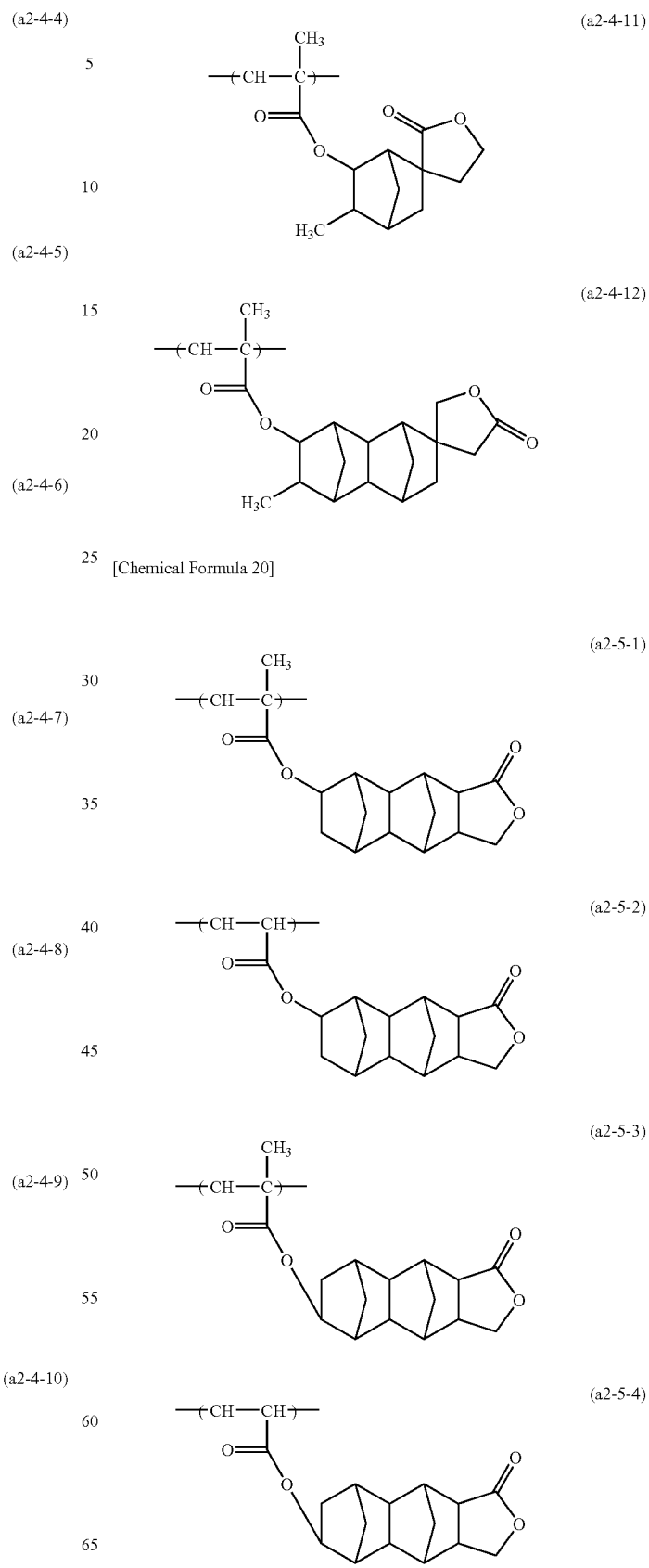

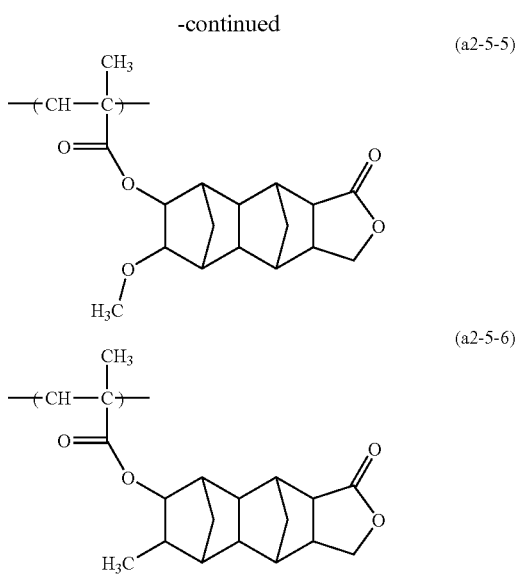

(a2-5-5)

(a2-5-6)

In the general formulas (a2-1) to (a2-5), R' is preferably a hydrogen atom taking account of easy availability.

At least one selected from the general formulas (a2-1) to (a2-5) is preferably used, and at least one selected from the general formulas (a2-1) to (a2-3) is more preferably used. Specifically, at least one selected from the chemical formulas (a0-1), (a2-1-2), (a2-2-1), (a2-2-2), (a2-3-1), (a2-3-2), (a2-3-9) and (a2-3-10) is preferably used.

In the polymer compound (A1), the constituent unit (a2) may be used alone or in combination.

The proportion of the constituent unit (a2) in the polymer compound (A1) is preferably from 10 to 80 mol %, more preferably from 15 to 55 mol %, and still more preferably from 25 to 50 mol %, based on the total of the entire constituent unit constituting the polymer compound (A1). By adjusting the proportion to the lower limit or more, sufficient effects by comprising the constituent unit (a2) can be exerted and, when the proportion is adjusted to the upper limit or less, it is possible to balance the constituent unit (a2) and the other constituent unit.

In the present invention, the polymer compound (A1) is preferably a copolymer comprising all of these constituent units (a0) to (a2) in view of excellent effects of the present invention, and is particularly preferably a copolymer consisting of constituent units (a0) to (a2).

Constituent Unit (a3)

The polymer compound (A1) may comprise, in addition to the constituent units (a0) and (a1) or the constituent units (a0), (a1) and (a2), a constituent unit derived from an α-lower alkyl)acrylate ester (a3) having a polar group-containing aliphatic hydrocarbon group. The constituent unit (a3) enhances hydrophilicity of the component (A) and affinity for a developing solution, and thus alkali solubility at the exposed area is improved and resolution is improved.

Examples of the polar group include hydroxyl group, cyano group, carboxy group, and hydroxyalkyl group wherein a portion of hydrogen atoms of an alkyl group are substituted with a fluorine atom, and a hydroxyl group is particularly preferable.

Examples of the aliphatic hydrocarbon group include a linear or branched hydrocarbon group having 1 to 10 carbon atoms (preferably, alkylene group) and a polycyclic aliphatic hydrocarbon group (polycyclic group). The polycyclic group can be used by appropriately selecting from a lot of groups proposed in a resin for resist composition for ArF excimer laser.

Among these, a constituent unit, which includes an aliphatic polycyclic group having a hydroxyl group, a cyano group, a carboxy group, or a hydroxyalkyl group wherein a portion of hydrogen atoms of an alkyl group are substituted with a fluorine atom, and is also derived from an (α-lower alkyl)acrylate ester, is preferable. The polycyclic group includes a group wherein one or more hydrogen atoms are eliminated from bicycloalkane, tricycloalkane, or tetracycloalkane. Specifically, it is a group wherein one or more hydrogen atoms are eliminated from a polycycloalkane such as adamantane, norbornane, isobornane, tricyclodecane, or tetracyclododecane. Such a polycyclic group can be used by appropriately selecting from a lot of groups proposed in a polymer (resin component) for resist composition for ArF excimer laser. Among these polycyclic groups, a group wherein two or more hydrogen atoms are eliminated from adamantane, a group wherein two or more hydrogen atoms are eliminated from norbornane, and a group wherein two or more hydrogen atoms are eliminated from tetracyclododecane are preferably from an industrial point of view.

The constituent unit (a3) is preferably a constituent unit derived from a hydroxyethylester of an (α-lower alkyl)acrylic acid when a hydrocarbon group in a polar group-containing aliphatic hydrocarbon group is a linear or branched hydrocarbon group having 1 to 10 carbon atoms, and is preferably a constituent unit represented by the formula (a3-1), a constituent unit represented by (a3-2), or a constituent unit represented by (a3-3) when the hydrocarbon group is a polycyclic group:

[Chemical Formula 21]

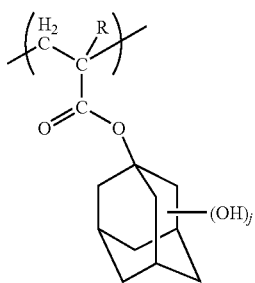

(a3-1)

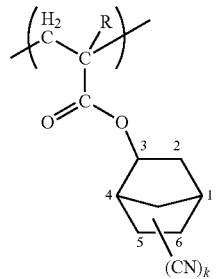

(a3-2)

-continued

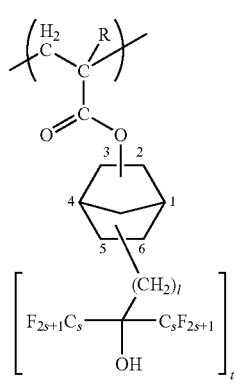

(a3-3)

wherein R is as defined above, j represents an integer of 1 to 3, k represents an integer of 1 to 3, t represents an integer of 1 to 3, l represents an integer of 1 to 5, and s represents an integer of 1 to 3.

In the formula (a3-1), j is preferably 1 and, particularly preferably, a hydroxyl group is bonded at the 3-position of an adamantyl group.

In the formula (a3-2), k is preferably 1. These compounds exist as a mixture of isomers (a mixture of compounds wherein a cyano group is bonded at the 5- or 6-position of a norbornyl group).

In the formula (a3-3), t is preferably 1. l is preferably 1. s is preferably 1. These compounds exist as a mixture of these isomers (a mixture of compounds wherein a 2-norbornyl group or a 3-norbornyl group is bonded at the ends of a carboxy group of an (a-lower alkyl)acrylic acid). A fluorinated alkylalcohol is preferably bonded at the 5- or 6-position of a norbornyl group.

The constituent unit (a3) may be used alone or in combination.

When the polymer compound (A1) comprises a constituent unit (a3), the proportion of the constituent unit (a3) in the polymer compound (A1) is preferably from 5 to 50 mol %, and more preferably from 10 to 35 mol %, based on the entire constituent unit constituting the polymer compound (A1).

Constituent Unit (a4)

The polymer compound (A1) may comprise a constituent unit (a4) other than the constituent units (a0) to (a3) as long as the effects of the present invention are not adversely affected.

The constituent unit (a4) is not specifically limited as long as it is the other constituent unit which is not categorized as the constituent units (a0) to (a3), and it is possible to use a lot of constituent units which have hitherto been known to be used as a resin for resist for ArF excimer laser, or KrF positive excimer laser (preferably for ArF excimer laser).

The constituent unit (a4) is preferably a constituent unit which has a non-acid dissociable aliphatic polycyclic group and is also derived from an (a-lower alkyl)acrylate ester. The polycyclic group includes the same groups as those exemplified in the case of the constituent unit (a 1), and it is possible to use a lot of constituent units which have hitherto been known to be used as a resin component of a resist composition for resist for ArF excimer laser, or KrF positive excimer laser (preferably for ArF excimer laser).

At least one selected from tricyclodecanyl group, adamantyl group, tetracyclododecanyl group, isobornyl group, and norbornyl group is particularly preferable in view of easy availability. These polycyclic groups may be substituted with a linear or branched alkyl group having 1 to 5 carbon atoms.

Specifically, the constituent unit (a4) includes those having structures of the following general formulas (a0-1) to (a4-5):

[Chemical Formula 22]

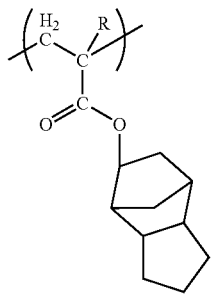

(a4-1)

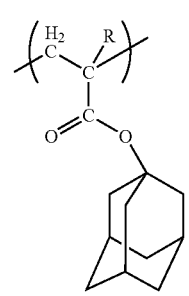

(a4-2)

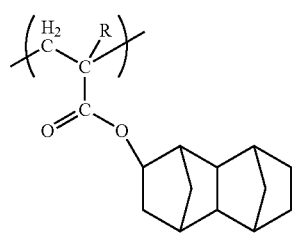

(a4-3)

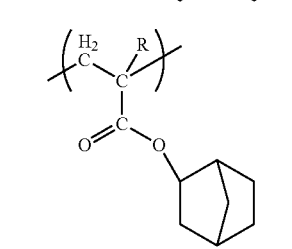

(a4-4)

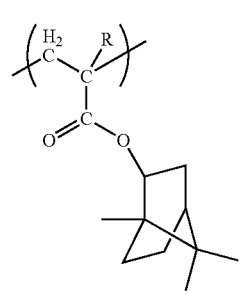

(a4-5)

wherein R is as defined above.

Such a constituent unit (a4) is not an essential component of the polymer compound (A1). When the constituent unit (a4) is added to the polymer compound (A1), the proportion of the constituent unit (a4) is preferably from 1 to 30 mol %, and more preferably from 10 to 20 mol %, based on the total of the entire constituent unit constituting the polymer compound (A1).

The polymer compound (A1) can be obtained by polymerizing a monomer, from which each constituent unit is derived, through known radical polymerization using a radical polymerization initiator such as azobisisobutyronitrile (AIBN).

In the case of the polymerization, a —$C(CF_3)_2$—OH group may be introduced at the end of the polymer compound (A1) by using in combination with a chain transfer agent such as HS—$CH_2$—$CH_2$—$CH_2$—$C(CF_3)_2$—OH. As described above, a copolymer having a hydroxyalkyl group, wherein a portion of hydrogen atoms of an alkyl group are substituted with a fluorine atom, introduced therein is effective to reduce development defects and LER (line edge roughness: irregularity of line side wall).

The weight average molecular weight (Mw) (polystyrene equivalent weight average molecular weight determined using gel permeation chromatography) of the polymer compound (A1) is not specifically limited and is within a range from 3,000 to 5,0000, more preferably from 5,000 to 20,000, and most preferably from 7000 to 17000. When the weight average molecular weight is less than the upper limit within the above range, the resulting resist has sufficient solubility to a resist solvent. When the weight average molecular weight is more than the lower limit within the above range, the resulting resist is excellent in dry etching resistance and resist pattern profile.

The dispersion degree (Mw/Mn) is preferably from 1.0 to 5.0, and more preferably from 1.0 to 3.0.

<<Positive Resist Composition>>

The positive resist composition of the present invention is a positive resist composition contains a resin component (A) wherein alkali solubility enhances by an action of an acid (hereinafter referred to as a component (A)), and an acid generator component (B) which generates an acid upon exposure (hereinafter referred to as a the component (B)).

In such a positive resist composition, when an acid is generated from the component (B) after exposure, the acid dissociates an acid dissociable dissolution inhibiting group of a component (A), and thus alkali solubility increases. Therefore, when the resist composition coated on a substrate is selectively exposed in the formation of a resist pattern, alkali solubility of the exposed area increases and thus alkali development can be conducted.

<Component (A)>

It is necessary that the component (A) contains the polymer compound (A1) of the present invention.

The polymer compound (A1) may be used alone or in combination.

In the component (A), the proportion of the polymer compound (A1) is preferably 50% by mass or more, more preferably from 80 to 100% by masse and most preferably 100% by mass, so as to exert the effects of the present invention.

In the present invention, the component (A) may contain, in addition to the polymer compound (A1), a resin which is commonly used as a chemically amplified positive resin for resist. Such a resin includes, for example, a polymer compound which does not comprise the constituent unit (a0) in the polymer compound (A1), comprises a constituent unit (a1) and comprises at least one selected optionally from the constituent units (a2) to (a4) (hereinafter referred to as a polymer compound (A2)).

As the polymer compound (A2), any of one or more compounds selected from those, which have hitherto been known as a resin component for a chemically amplified positive resist, can be used.

More specifically, the polymer compound (A2) includes a polymer compound comprising the constituent units (a1), (a2) and/or (a3) (hereinafter referred to as a polymer compound (A2-1)).

In the polymer compound (A2-1), the proportion of the constituent unit (a1) is preferably from 5 to 80 mol %, and more preferably from 10 to 70 mol %, based on the total of the entire constituent unit of the polymer compound (A2-1). Also, the proportion of the constituent unit (a2) is preferably from 5 to 50 mol %, and more preferably from 10 to 40 mol %, based on the total of the entire constituent unit of the polymer compound (A2-1). Also, the proportion of the constituent unit (a3) is preferably from 5 to 80 mol %, and more preferably from 10 to 60 mol %, based on the total of the entire constituent unit of the polymer compound (A2-1).

The polymer compound (A2-1) may further comprise the constituent unit (a4).

The weight average molecular weight of the polymer compound (A2-1) is preferably from 5,000 to 30,000, and more preferably from 6000 to 20,000. Also, the dispersion degree (Mw/Mn) is preferably from 1.0 to 5.0, and more preferably from 1.0 to 3.0.

The proportion of the polymer compound (A2) in the positive resist composition is not specifically limited. To obtain the effect due to the addition of the polymer compound (A2), a mixing ratio (mass ratio) of the polymer compound (A1) to the polymer compound (A2) is preferably from 9:1 to 1:9, more preferably from 8:2 to 2:8, and most preferably from 5:5 to 2:8.

The proportion of the component (A) in the positive resist composition can be appropriately adjusted according to the thickness of the objective resist film.

<Component (B)>

The component (B) is not specifically limited and it is possible to use those which have hitherto been proposed as an acid generator for a chemically amplified positive resist.

As such an acid generator, there have hitherto been known various acid generators, for example, onium salt-based acid generator such as iodonium salt or sulfonium salt; oxime sulfonate-based acid generator; diazomethane-based acid generator such as bisalkyl or bisarylsulfonyl diazomethanes or poly(bissulfonyl)diazomethanes; nitrobenzylsulfonate-based acid generator; iminosulfonate-based acid generator; and disulphone-based acid generator.

Specific examples of such an onium salt-based acid generator include trifluoromethanesulfonate or nonafluorobutanesulfonate of diphenyliodonium, trifluoromethanesulfonate or nonafluorobutanesulfonate of bis(4-tert-butylphenyl)iodonium, trifluoromethanesulfonate of triphenylsulfonium, heptafluoropropanesulfonate or nonafluorobutanesulfonate thereof, trifluoromethanesulfonate of tri(4-methylphenyl)sulfonium, heptafluoropropanesulfonate or nonafluorobutanesulfonate thereof, trifluoromethanesulfonate of dimethyl(4-hydroxynaphthyl)sulfonium, heptafluoropropanesulfonate or nonafluorobutanesulfonate thereof, trifluoromethanesulfonate of monophenyldimethylsulfonium, heptafluoropropanesulfonate or nonafluorobutanesulfonate thereof, trifluoromethanesulfonate of diphenylmonomethylsulfonium, heptafluoropropanesulfonate or nonafluorobutanesulfonate thereof, trifluoromethanesulfonate of (4-methylphenyl)diphenylsulfonium, heptafluoropropanesulfonate or nonafluorobutanesulfonate thereof, trifluoromethanesulfonate of (4-methoxyphenyl)diphenylsulfonium, heptafluoropropanesulfonate or nonafluorobutanesulfonate thereof, trifluoromethanesulfonate of tri(4-tert-butyl)phenylsulfonium, and heptafluoropropanesulfonate or nonafluorobutanesulfonate thereof.

Specific examples of the oxime sulfonate-based acid generator include a-(p-toluenesulfonyloxyimino)-benzylcyanide, a-(p-chlorobenzenesulfonyloxyimino)-benzylcyanide, a-(4-nitrobenzenesulfonyloxyimino)-benzylcyanide, a-(4-nitro-2-trifluoromethylbenzenesulfonyloxyimino)-benzylcyanide, a-(benzenesulfonyloxyimino)-4-chlorobenzylcyanide, a-(benzenesulfonyloxyimino)-2,4-dichlorobenzylcyanide, a-(benzenesulfonyloxyimino)-2,6-dichlorobenzylcyanide, a-(benzenesulfonyloxyimino)-4-methoxybenzylcyanide, a-(2-chlorobenzenesulfonyloxyimino)-4-methoxybenzylcyanide, a-(benzenesulfonyloxyimino)-thien-2-ylacetonitrile, a-(4-dodecylbenzenesulfonyloxyimino)-benzylcyanide, a-[(p-toluenesulfonyloxyimino)-4-methoxyphenyl]acetonitrile, a-[(dodecylbenzenesulfonyloxyimino)-4-methoxyphenyl]acetonitrile, a-(tosyloxyimino)-4-thienylcyanide, a-(methylsulfonyloxyimino)-1-cyclopentenylacetonitrile, a-(methylsulfonyloxyimino)-1-cyclohexenylacetonitrile, a-(methylsulfonyloxyimino)-1-octenylacetonitrile, a-(trifluoromethylsulfonyloxyimino)-1-cyclopentenylacetonitrile, a-(trifluoromethylsulfonyloxyimino)-cyclohexylacetonitrile, a-(ethylsulfonyloxyimino)-ethylacetonitrile, a-(propylsulfonyloxyimino)-propylacetonitrile, a-(cyclohexylsulfonyloxyimino)-cyclopentylacetonitrile, a-(cyclohexylsulfonyloxyimino)-cyclohexylacetonitrile, a-(cyclohexylsulfonyloxyimino)-1-cyclopentenylacetonitrile, a-(ethylsulfonyloxyimino)-1-cyclopentenylacetonitrile, a-(isopropylsulfonyloxyimino)-1-cyclopentenylacetonitrile, a-(n-butylsulfonyloxyimino)-1-cyclopentenylacetonitrile, a-(ethylsulfonyloxyimino)-1-cyclohexenylacetonitrile, a-(isopropylsulfonyloxyimino)-1-cyclohexenylacetonitrile, a-(n-butylsulfonyloxyimino)-1-cyclohexenylacetonitrile, a-(methylsulfonyloxyimino)-phenylacetonitrile, a-(methylsulfonyloxyimino)-p-methoxyphenylacetonitrile, a-(trifluoromethylsulfonyloxyimino)-phenylacetonitrile, a-(trifluoromethylsulfonyloxyimino)-p-methoxyphenylacetonitrile, a-(ethylsulfonyloxyimino)-p-methoxyphenylacetonitrile, a-(propylsulfonyloxyimino)-p-methylphenylacetonitrile, and a-(methylsulfonyloxyimino)-p-bromophenylacetonitrile. Among these, a-(methylsulfonyloxyimino)-p-methoxyphenylacetonitrile is preferable.

It is also possible to use oxime sulfonate-based acid generators represented by the following chemical formulas:

[Chemical Formula 23]

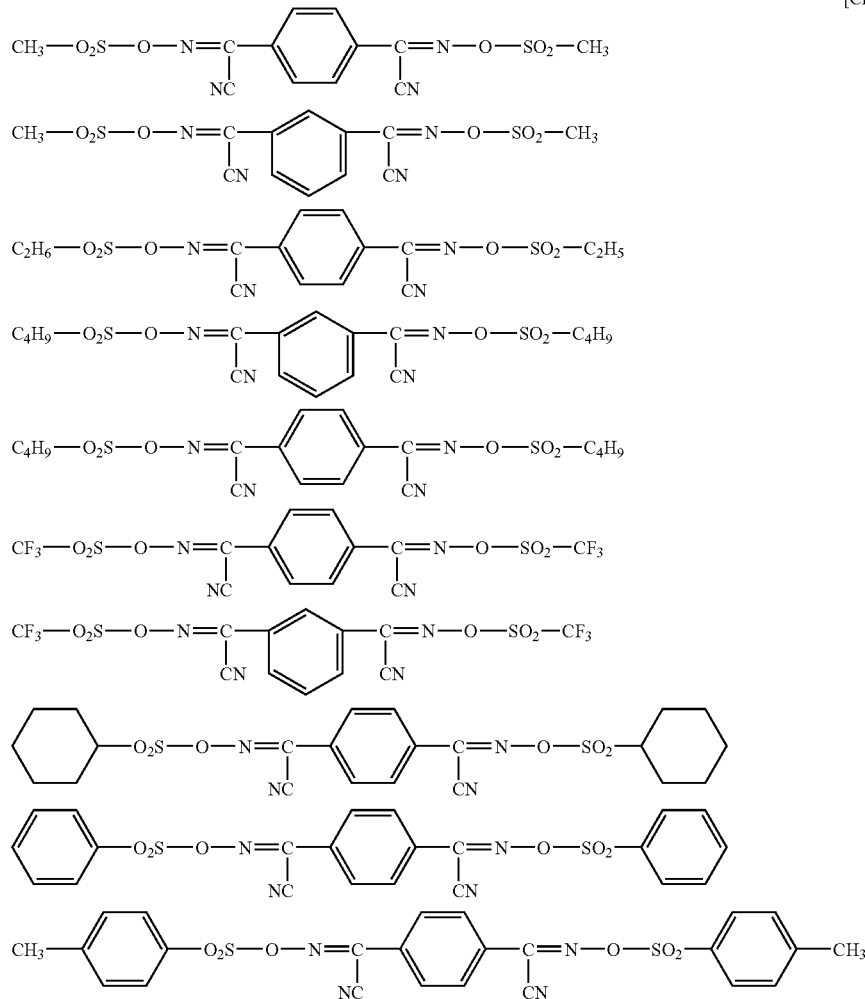

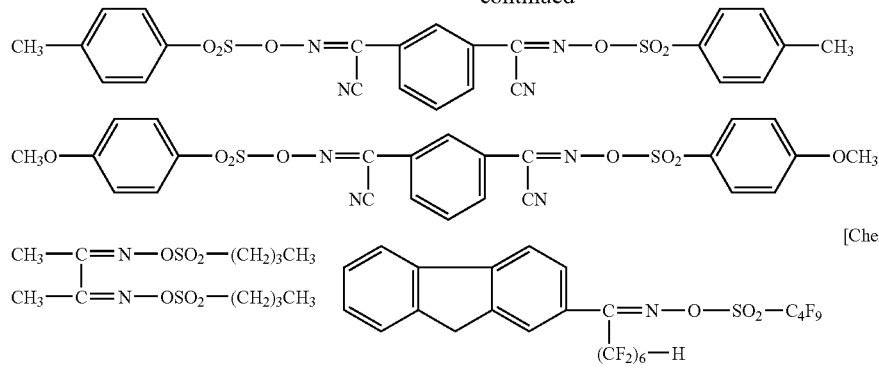

Among the diazomethane-based acid generators, specific examples of the bisalkyl or bisarylsulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Examples of the poly(bissulfonyl)diazomethanes include 1,3-bis(phenylsulfonyl diazomethylsulfonyl)propane (compound A, decomposition point: 135° C.), 1,4-bis(phenylsulfonyl diazomethylsulfonyl)butane (compound B, decomposition point: 147° C.), 1,6-bis(phenylsulfonyldiazomethylsulfonyl)hexane (compound C, melting point: 132° C., decomposition point: 145° C.), 1,10-bis(phenylsulfonyl diazomethylsulfonyl)decane (compound D, decomposition point: 147° C.), 1,2-bis(cyclohexylsulfonyl diazomethylsulfonyl)ethane (compound E, decomposition point: 149° C.), 1,3-bis(cyclohexylsulfonyl diazomethylsulfonyl)propane (compound F, decomposition point: 153° C.), 1,6-bis(cyclohexylsulfonyl diazomethylsulfonyl)hexane (compound G, melting point: 109° C., decomposition point: 122° C., and 1,10-bis(cyclohexylsulfonyl diazomethylsulfonyl)decane (compound H, decomposition point: 116° C.), each having the following structure.

[Chemical Formula 25]

COMPOUND A

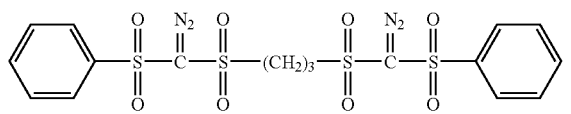

COMPOUND B

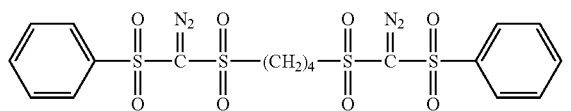

COMPOUND C

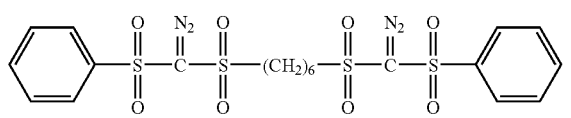

COMPOUND D

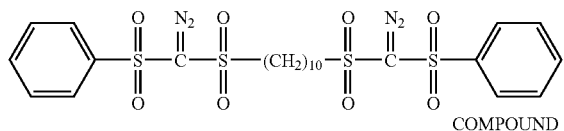

COMPOUND E

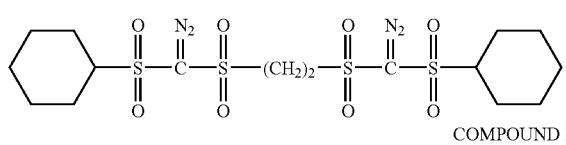

COMPOUND F

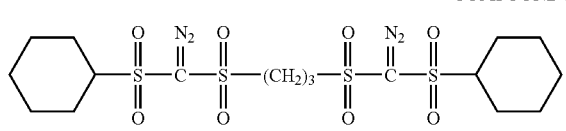

COMPOUND G

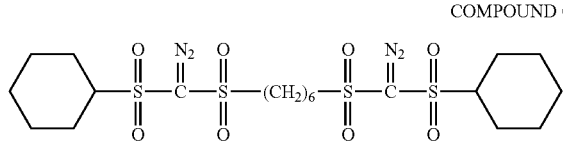

COMPOUND H

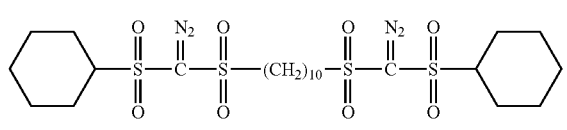

In the present invention, an onium salt containing fluorinated alkylsulfonic acid ions as an anion is preferably used as the component (B).

As the component (B), acid generators may be used alone or in combination.

The content of the component (B) is adjusted within a range from 0.5 to 30 parts by mass, and preferably from 1 to 10 parts by mass, based on 100 parts by mass of the component (A). A pattern is sufficiently formed by adjusting the content within the above range. It is also preferable that a uniform solution is obtained and storage stability is improved.

The positive resist composition of the present invention can be prepared by dissolving the above components (A) and (B), and various optional components described hereinafter in an organic solvent (hereinafter referred to as a component (C), sometimes).

The component (C) may be an organic solvent which can dissolve the respective components used to give a uniform solution, and one or more kinds of organic solvents can be used after appropriately selecting from those which have conventionally known as a solvent of a chemically amplified resist.

Examples thereof include lactones such as γ-butyrolactone; ketones such as acetone, methyl ethyl ketone, cyclohexanone, methyl isoamyl ketone, and 2-heptanone; polyhydric alcohols and derivatives thereof, such as ethylene glycol, ethylene glycol monoacetate, diethylene glycol, diethylene glycol monoacetate, propylene glycol, propylene glycol monoacetate, dipropylene glycol, or monomethyl ether, monoethyl ether, monopropyl ether, monobutyl ether or monophenyl ether of dipropylene glycol monoacetate; cyclic ethers such as dioxane; esters such as methyl lactate, ethyl lactate (EL), methyl acetate, ethyl acetate, butyl acetate, methyl pyruvate, ethyl pyruvate, methyl methoxypropionate methyl, ethyl ethoxypropionate.

These organic solvents may be used alone or in combination.

A mixed solvent obtained by mixing propylene glycol monomethyl ether acetate (PGMEA) with a polar solvent is preferable. A mixing ratio (mass ratio) of PGMEA to the polar solvent may be appropriately decided taking account of compatibility, but is preferably adjusted within a range from 1:9 to 9:1, and more preferably from 2:8 to 8:2.

More specifically, when mixed with EL as the polar solvent, a mass ratio PGMEA:EL is preferably from 1:9 to 9:1, and more preferably from 2:8 to 8:2.

In addition, a mixed solvent of at least one selected from PGMEA and EL, and γ-butyrolactone is also preferable as the organic solvent. In this case, the mass ratio of the former to the latter is preferably from 70:30 to 95:5.

The amount of the component (C) is not specifically limited and is appropriately set according to the thickness of a coating film so as to adjust to the concentration which enables coating on a substrate, and is adjusted so that the solid content of the resist composition is within a range from 2 to 20% by mass, and preferably from 5 to 15% by mass.

The positive resist composition can further contain, as an optional component, a nitrogen-containing organic compound (D) (hereinafter referred to as a component (D)) so as to improve a resist patterns shape and post exposure delay stability.

Since various ones are proposed as the component (D), any one may selected from known ones may be used and examples thereof include monoalkylamine such as n-hexylamine, n-heptylamine, n-octylamine, n-nonylamine, or n-decylamine; dialkylamine such as diethylamine, di-n-propylamine, di-n-heptylamine, di-n-octylamine, or dicyclohexylamine; trialkylamine such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, or tri-n-dodecylamine; and alkyl alcoholamine such as diethanolamine, triethanolamine, diisopropanolamine, triisopropanolamine, di-n-octanolamine, or tri-n-octanolamine. Among these, a secondary aliphatic amine and a tertiary aliphatic amine are preferable and a tertiary alkanolamine such as triethanolamine or triisopropanolamine is most preferable.

These components may be used alone or in combination.

The component (D) is commonly used in an amount within a range from 0.01 to 5.0 parts by mass based on 100 parts by mass of the component (A).

The positive resist composition of the present invention can further contain, as an optional component, an organic carboxylic acid, or oxo acid of phosphorus, or a derivative thereof (E) (hereinafter referred to as a component (E)) for the purpose of preventing deterioration of sensitivity by mixing of the component (D), and improving resist pattern shape, and post exposure delay stability. The components (D) and (E) can be used alone or in combination.

As the organic carboxylic acid, for example, malonic acid, citric acid, malic acid, succinic acid, benzoic acid, and salicylic acid are preferable.

Examples of the oxo acid of phosphorus or the derivative thereof include phosphoric acid or a derivative such as ester thereof, such as phosphoric acid, di-n-butyl phosphate ester, or phenyl phosphate ester; phosphonic acid or a derivative such as ester thereof, such as phosphonic acid, dimethyl phosphonate ester, di-n-butyl phosphonate ester, phenylphosphonic acid, diphenyl phosphonate ester, or dibenzyl phosphonate ester; and phosphinic acid or a derivative such as ester thereof, such as phosphinic acid or phenylphosphinic acid. Among these, phosphonic acid is particularly preferable.

The component (E) is usually used in the proportion within a range from 0.01 to 5.0 parts by mass based on 100 parts by mass of the component (A).

To the positive resist composition of the present invention, if desired, additives having miscibility, for example, additive resins for improving performances of a resist film, surfactants for improving coatability, dissolution inhibitors, plasticizers, stabilizers, colorants, antihalation agents, and dyes can be appropriately added.

<<Resist Pattern Forming Method>>

A resist pattern forming method of the present invention can be performed in the following manner.

First, the above positive resist composition is coated on a substrate such as silicone wafer using a spinner, and prebaked under temperature conditions of 80 to 150° C. for 40 to 120 seconds, preferably 60 to 90 seconds, followed by selective exposure through a desired mask pattern using an ArF aligner, and further PEB (post exposure baking) under temperature conditions of 80 to 150° C. for 40 to 120 seconds, preferably 60 to 90 seconds. Then, a development treatment is performed using an alkali developing solution, for example, an aqueous 0.1 to 10 mass % tetramethylammonium hydroxide (TMAH) solution. Thus, it is possible to obtain a resist pattern which is faithful to the mask pattern.

It is also possible to provide an organic or inorganic anti-reflective film between the substrate and the coating layer of the resist composition.

The wavelength of light to be used for exposure is not specifically limited and the exposure can be conducted using radiations such as ArF excimer laser, KrF excimer laser, $F_2$ excimer laser, EUV (extreme ultraviolet rays), VUV (vacuum ultraviolet rays), EB (electron beam), X-rays, and soft X-rays. The photoresist composition of the present invention is particularly effective to ArF excimer laser.

By a resist pattern forming method using the above polymer compound (A1) of the present invention, a positive resist composition containing the polymer compound and the positive resist pattern, it is possible to form a resist pattern which has high affinity for an alkali developing solution and high resolution.

Although the reason why such an effect is obtained is not sure, it is considered that a group wherein an oxygen atom is bonded with a specific aliphatic polycyclic group increases acidity of a resin as compared with the case of having a polar group such as hydroxyl group and thus solubility in an alkali is enhanced.

Because of high affinity for an alkali developing solution, reduction of development defects and LER can be expected.

EXAMPLES

Examples of the present invention will now be described, but the scope of the present invention is not limited to these examples.

The structures of monomer components (compounds (1) to (4) represented by the following formulas (1) to (4)) used in the following Synthesis Example 1 and Comparative Synthesis Example 1 are shown below.

[Chemical Formula 26]

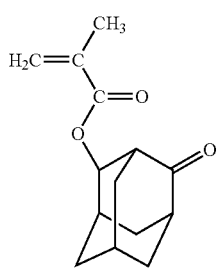
(1)

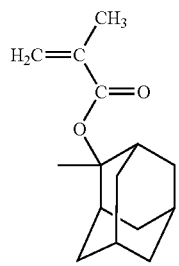
(2)

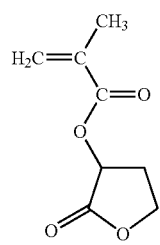
(3)

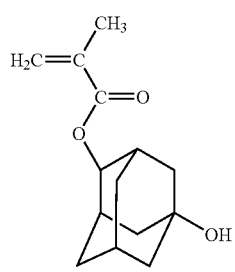
(4)

Synthesis Example 1

3.0 g of a compound (1), 6.0 g of a compound (2) and 4.3 g of a compound (3) were dissolved in 100 ml of tetrahydrofuran, and then 0.52 g of azobisisobutyronitrile was added. After refluxing for 6 hours, the reaction solution was added dropwise in a 1 L of n-heptane. The precipitated resin was collected by filtration and then dried under reduced pressure to obtain a white powdered resin. This resin is referred to as a resin 1 and the structural formula is shown as follows. The weight average molecular weight (Mw) of the resin 1 was 15,200 and the dispersion degree (Mw/Mn) was 2.8. As a result of the measurement of carbon 13 nuclear magnetic resonance spectrum ($^{13}$C-NMR), a composition ratio (molar ratio) of the respective constituent units shown in the following structural formulas, m:n:l, was 40.7:43.3:16.

[Chemical Formula 27]

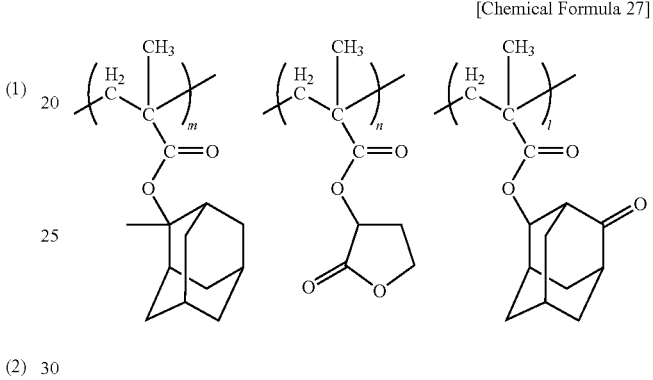

Comparative Synthesis Example 1

18.7 g of a compound (2), 13.6 g of a compound (3) and 9.5 g of a compound (4) were dissolved in 200 ml of tetrahydrofuran, and then 1.64 g of azobisisobutyronitrile was added. After refluxing for 6 hours, the reaction solution was added dropwise in a 1 L of n-heptane. The precipitated resin was collected by filtration and then dried under reduced pressure to obtain a white powdered resin. This resin is referred to as a resin 4 and the structural formula is shown as follows. The weight average molecular weight (Mw) of the comparative resin 1 was 13,300 and the dispersion degree (Mw/Mn) was 2.5. As a result of the measurement of carbon 13 nuclear magnetic resonance spectrum ($^{13}$C-NMR), a composition ratio (molar ratio) of the respective constituent units shown in the following structural formulas, m:n:l, was 33.6:43.8:22.6.

[Chemical Formula 28]

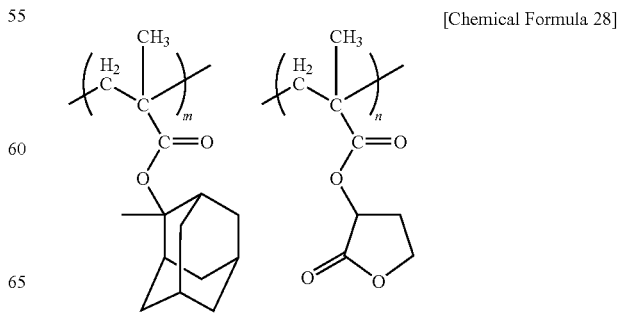

-continued

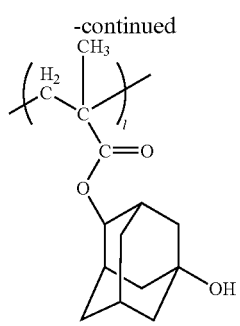

Example 1

100 parts by mass of the resin 1, 3 parts by mass of triphenylsulfonium nonafluorobutanesulfonate (TPS-PFBS) and 0.35 parts by mass of triethanolamine were dissolved in 1230 parts by mass of propylene glycol monomethylether acetate (PGMEA) to obtain a positive resist composition.

Then, the following evaluation was conducted.

A material for organic antireflective film (manufactured by Brewer Science, Inc., trade name: ARC-29) was coated on a 8 inch silicone wafer and then fired at 225° C. for 60 seconds to form a 77 nm thick antireflective film, and thus a substrate was obtained.

The resulting positive resist composition was uniformly coated on the substrate using a spinner, prebaked on a hot plate at 130° C. for 90 seconds and then dried to form a 250 nm thick resist layer. Then, the resist layer was selectively exposed through a 6% halftone mask using an ArF exposure apparatus (wavelength: 193 nm) NSR-S302 (manufactured by Nikon Corporation, NA (numerical aperture) 0.60, ⅔ zonal illumination).

The resist layer was subjected to a PEB treatment under the conditions of a temperature of 130° C. for 90 seconds, puddle developed with a developing solution (aqueous 2.38 mass % tetramethylammonium hydroxide solution) at 23° C. for 60 seconds, and water rinsed with pure water for 30 seconds, followed by shake-off drying to form a resist pattern of line-and-space (1:1) at 120 nm (hereinafter referred to as a L/S pattern).

<Sensitivity>

Using, as sensitivity (EOP), a dosage where line-and-space (L/S) pattern (1:1) at 130 nm is formed, sensitivity was measured by mJ/cm$^2$ (energy amount) unit. As a result, sensitivity was 26 mJ/cm$^2$.

<Resolution>

Critical resolution (L/S pattern (1:1)) in the above sensitivity (EOP) was judged by a SEM microphotograph. As a result, critical resolution was 120 nm.

<Contact Angle>

The contact angle was measured using a FACE contact angle meter, Model CA-X150 (product name, manufactured by Kyowa Interface Science Co., LTD.). The contact angle was measured by the following procedure. That is, 100 parts by mass of the resin 1 was dissolved in 1350 parts by mass of PGMEA to prepare a resin solution. Then, the resin solution was coated on a 8 inch silicone wafer using a spinner and heated at 130° C. for 90 seconds to form a 250 nm thick resin film. A syringe mounted in the contact angle meter was brought into contact with the resin film (when the syringe is brought into contact with the resin film, 2 μL of an aqueous 2.38 mass % tetramethylammonium hydroxide solution is added dropwise) and the contact angle (contact angle to an alkali developing solution) was measured. As a result, the contact angle was 62.60.

Comparative Example 1

In the same manner as in Example 1, except that the resin 1 in Example 1 was replaced by a comparative resin 1, a positive resist composition was prepared and then evaluated in the same manner.

As a result, sensitivity was 19 mJ/cm$^2$, resolution was 120 nm, and contact angle was 64.2°.

TABLE 1

|  | Resolution (nm) | Contact angle (°) |
| --- | --- | --- |
| Example 1 | 120 | 62.6 |
| Comparative Example 1 | 120 | 64.2 |

As is apparent from the results described above, a resist pattern having high affinity for an alkali developing solution could be formed by the positive resist composition of Example 1 wherein the resin 1 corresponding to the polymer compound of the present invention (A1) was used, without exerting an adverse influence on resolution.

INDUSTRIAL APPLICABILITY

The present invention can be applied to a resist composition which has high affinity for an alkali developing solution and also can form a resist pattern with high resolution, a polymer compound suited for use as the resist composition, and a resist pattern forming method.

The invention claimed is:

1. A polymer compound comprising at least one constituent unit (a0) selected from the group consisting of constituent units represented by the following general formulas (a0-1), (a0-2), (a0-3) and (a0-4),

[Chemical Formula 1]

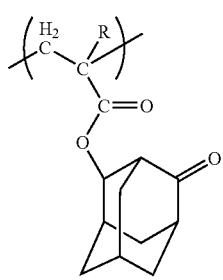

(a0-1)

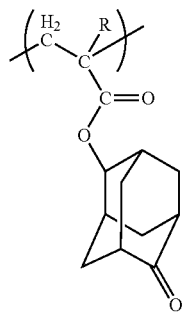

(a0-2)

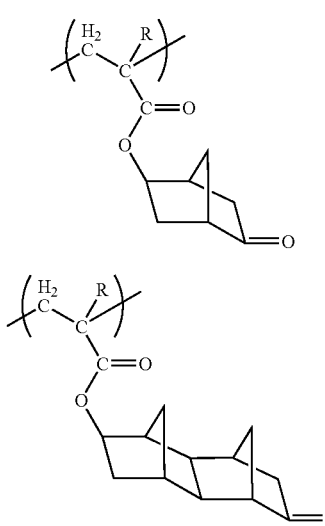

wherein R represents a hydrogen atom or a lower alkyl group, and a constituent unit (a1) derived from an (α-lower alkyl)acrylate ester having an acid dissociable dissolution inhibiting group.

2. The polymer compound according to claim 1, wherein the proportion of the constituent unit (a0) is from 10 to 60 mol % based on the entire constituent unit constituting the polymer compound.

3. The polymer compound according to claim 1 or 2, wherein the proportion of the constituent unit (a1) is from 10 to 80 mol % based on the entire constituent unit constituting the polymer compound.

4. The polymer compound according to claim 1 or 2, further comprising a constituent unit (a2) derived from an (α-lower alkyl)acrylate ester having a lactone-containing monocyclic or polycyclic group.

5. The polymer compound according to claim 4, wherein the proportion of the constituent unit (a2) is from 10 to 80 mol % based on the entire constituent unit constituting the polymer compound.

6. The polymer compound according to claim 1 or 2, wherein the weight average molecular weight is from 3,000 to 50,000.

7. A positive resist composition comprising a resin component (A) wherein alkali solubility is enhanced by an action of an acid, and an acid generator component (B) which generates an acid upon exposure, wherein
The resin component (A) contains the polymer compound according to claim 1 or 2.

8. The positive resist composition according to claim 7, further comprising a nitrogen-containing organic compound (D).

9. A resist pattern forming method comprising:
forming a resist film on a substrate using the positive resist composition according to claim 7;
exposing the resist film; and
developing the resist film to form a resist pattern.

* * * * *

UNITED STATES PATENT AND TRADEMARK OFFICE
CERTIFICATE OF CORRECTION

| | | |
|---|---|---|
| PATENT NO. | : 7,851,127 B2 | Page 1 of 1 |
| APPLICATION NO. | : 11/576518 | |
| DATED | : December 14, 2010 | |
| INVENTOR(S) | : Toshiyuki Ogata, Shogo Matsumaru and Hideo Hada | |

It is certified that error appears in the above-identified patent and that said Letters Patent is hereby corrected as shown below:

At Column 6, Line 49, Change "1 to" to --1 to 5--.

At Column 28, Line 4 (Approx.), Change "(a1-4-13" to --(a1-4-13)--.

At Column 35, Line 5, Change "hydrtophilicity" to --hydrophilicity--.

At Column 43, Line 31, Change "(a0-1)," to --(a2-1-1),--.

At Column 43, Line 54, Change "α-lower" to --(α-lower--.

At Column 46, Line 4, Change "(a0-1)" to --(a4-1)--.

At Column 47, Line 39 (Approx.), Change "a the" to --a--.

At Column 47, Line 57, Change "masse" to --mass,--.

At Column 57, Line 35, Change "0.60," to --=0.60,--.

At Column 58, Line 4, Change "62.60." to --62.6°.--.

At Column 60, Line 20, In Claim 7, change "The" to --the--.

At Column 60, Line 25 (Approx.), In Claim 9, after "method" insert --,--.

Signed and Sealed this

Eighteenth Day of October, 2011

David J. Kappos
*Director of the United States Patent and Trademark Office*